(12) United States Patent
Zhu et al.

(10) Patent No.: US 11,616,158 B2
(45) Date of Patent: Mar. 28, 2023

(54) MULTI-LAYERED PEROVSKITES, DEVICES, AND METHODS OF MAKING THE SAME

(71) Applicants: Alliance for Sustainable Energy, LLC, Golden, CO (US); Shanghai Jiao Tong University, Minhang (CN)

(72) Inventors: Kai Zhu, Littleton, CO (US); Yixin Zhao, Shanghai (CN); Mengjin Yang, Lakewood, CO (US); Taiyang Zhang, Shanghai (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/871,406

(22) Filed: May 11, 2020

(65) Prior Publication Data
US 2020/0279964 A1    Sep. 3, 2020

Related U.S. Application Data

(62) Division of application No. 15/777,275, filed as application No. PCT/US2016/062431 on Nov. 17, 2016.

(Continued)

(51) Int. Cl.
*H01L 31/055* (2014.01)
*H01L 51/00* (2006.01)
(Continued)

(52) U.S. Cl.
CPC ......... *H01L 31/055* (2013.01); *B32B 15/043* (2013.01); *C07F 7/24* (2013.01); *H01L 31/0256* (2013.01); *H01L 51/0003* (2013.01); *H01L 51/0032* (2013.01); *B32B 2307/202* (2013.01); *B32B 2311/14* (2013.01); *B32B 2311/16* (2013.01); *B32B 2457/12* (2013.01);
(Continued)

(58) Field of Classification Search
None
See application file for complete search history.

(56) References Cited

U.S. PATENT DOCUMENTS 9,391,287 B1 *  7/2016  Huang ............... H01L 51/4213
2015/0136232 A1  5/2015  Snaith et al.
(Continued)

FOREIGN PATENT DOCUMENTS

| EP | 2 940 751 A1 | 11/2015 |
|---|---|---|
| WO | 2013171520 A1 | 11/2013 |
| WO | 2014045021 A1 | 3/2014 |

OTHER PUBLICATIONS

Pellet et al. Chem. Mater. 2015, 27, 2181-2188.*
(Continued)

*Primary Examiner* — Clinton A Brooks
(74) *Attorney, Agent, or Firm* — Michael A. McIntyre

(57) ABSTRACT

Methods are described that include contacting an alkyl ammonium metal halide film with an alkyl ammonium halide, where the alkyl ammonium metal halide film includes a first halogen and a metal, the alkyl ammonium halide includes a second halogen, such that the contacting forms an alkyl ammonium metal mixed-halide film that interfaces with the alkyl ammonium metal halide film, where the alkyl ammonium metal mixed-halide film includes the first halogen, the second halogen, and the metal.

7 Claims, 28 Drawing Sheets

Related U.S. Application Data

(60) Provisional application No. 62/258,201, filed on Nov. 20, 2015, provisional application No. 62/303,449, filed on Mar. 4, 2016.

(51) Int. Cl.
  *B32B 15/04* (2006.01)
  *C07F 7/24* (2006.01)
  *H01L 31/0256* (2006.01)
  *H01L 51/42* (2006.01)

(52) U.S. Cl.
  CPC ...... *C01P 2002/34* (2013.01); *C01P 2002/72* (2013.01); *C01P 2004/03* (2013.01); *H01L 51/4226* (2013.01); *H01L 2031/0344* (2013.01)

(56) References Cited

U.S. PATENT DOCUMENTS

| | | | |
|---|---|---|---|
| 2015/0249170 A1 | 9/2015 | Snaith et al. | |
| 2016/0035917 A1* | 2/2016 | Gershon | H01L 31/18 438/93 |
| 2017/0133163 A1* | 5/2017 | Russell | H01L 27/302 |

OTHER PUBLICATIONS

Ahn et al., "Highly Reproducible Perovskite Solar Cells with Average Efficiency of 18.3% and Best Efficiency of 19.7% Fabricated via Lewis Base Adduct of Lead (II) Iodide," Journal of the American Chemical Society, 2015, vol. 137, pp. 8696-8699.

Baldan et al., "Progress in Ostwald ripening theories and their applications to nickel-base superalloys," Journal of Materials Science, 2002, vol. 37, pp. 2171-2202.

Bi et al., "Using a two-step deposition technique to prepare perovskite (CH3NH3PbI3) for thin film solar cells based on ZrO2 and TiO2 mesostructures," RSC Advances, 2013, vol. 3, pp. 18762-18766.

Gao et al., "Organohalide lead perovskites for photovoltaic applications," Energy & Environmental Science, 2014, vol. 7, pp. 2448-2463.

Gaspera et al., "Ultra-thin high efficiency semitransparent perovskite solar cells," Nano Energy, 2015, vol. 13, pp. 249-257.

Harms et al., "Mesoscopic photosystems for solar light harvesting and conversion: facile and reversible transformation of metal-halide perovskites," Royal Society of Chemistry, 2014, vol. 176, pp. 251-269.

Heo et al., "Hysteresis-less inverted CH3NH3PbI3 planar perovskite hybrid solar cells with 18.1% power conversion efficiency," Energy & Environmental Science, 2015, vol. 8, pp. 1602-1608.

Jang et al., "Reversible Halide Exchange Reaction of Organometal Trihalide Perovskite Colloidal Nanocrystals for Full-Range Band Gap Tuning," Nano Letters, 2015, vol. 15, pp. 5191-5199.

Jeon et al., "Solvent engineering for high-performance inorganic-organic hybrid perovskite solar cells," Nature Materials, 2014, vol. 13, pp. 897-903.

Noh et al., "Chemical Management for Colorful, Efficient, and Stable Inorganic-Organic Hybrid Nanostructured Solar Cells," Nano Letters, 2013, vol. 13, 1764-1769.

Pellet et al., "Transforming Hybrid Organic Inorganic Perovskites by Rapid Halide Exchange," Chemistry of Materials, 2015, vol. 27, pp. 2181-2188.

Schlipf et al., "A Closer Look into Two-Step Perovskite Conversion with X-ray Scattering," Journal of Physical Chemistry Letters, 2015, vol. 6, pp. 1265-1269.

Xiao et al., "A Fast Deposition-Crystallization Procedure for Highly Efficient Lead Iodide Perovskite Thin-Film Solar Cells," Angewandte Communications, International Edition, 2014, vol. 53, pp. 9898-9903.

Xiao et al., "Solvent Annealing of Perovskite-Induced Crystal Growth for Photovoltaic-Device Efficiency Enhancement," Advanced Materials, 2014, vol. 26, pp. 6503-6509.

Yang et al., "Formation Mechanism of Freestanding CH3NH3PbI3 Functional Crystals: In Situ Transformation vs Dissolution-Crystallization," Chemistry of Materials, 2014, vol. 26, pp. 6705-6710.

Yang et al., "Facile fabrication of large-grain CH3NH3PbI3-xBrx films for high-efficiency solar cells via CH3NH3Br-selective Ostwald ripening," Nature Communications, 2016, 9 pages.

Zhao et al., "Solution Chemistry Engineering toward High-Efficiency Perovskite Solar Cells," Journal of Physical Chemistry Letters, 2014, vol. 5, pp. 4175-4186.

International Search Report from corresponding PCT patent application No. PCT/US16/62431, dated Feb. 1, 2017, 3 pages.

Written Opinion of the International Searching Authority from corresponding PCT patent application No. PCT/US16/62431, dated Feb. 1, 2017, 4 pages.

Akkerman et al., "Tuning the Optical Properties of Cesium Lead Halide Perovskite Nanocrystals by Anion Exchange Reactions," Journal of the American Chemical Society, vol. 137, 2015, pp. 10275-10281.

Extended European Search Report from corresponding European patent application No. 16867100.6, dated Jun. 13, 2019, 5 pages.

\* cited by examiner

MULTI-LAYERED PEROVSKITES, DEVICES, AND METHODS OF MAKING THE SAME

CROSS-REFERENCE TO RELATED APPLICATIONS

This application is a divisional of, and claims the benefits of U.S. Non-provisional patent application Ser. No. 15/777,275, filed on May 18, 2018, which is the national stage entry of PCT Patent Application No. PCT/US16/62431, filed on Nov. 17, 2016, which claims priority to U.S. Provisional Application Nos. 62/258,201 and 62/303,449 filed Nov. 20, 2015 and Mar. 4, 2016 respectively, the contents of which are incorporated herein by reference in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Perovskite halides (e.g., $CH_3NH_3PbI_3$ or $MAPbI_3$) represent a new class of light absorbers that have demonstrated exceptional, unparalleled progress in solar cell performance from 3.8% in 2009 to a certified 17.9% in 2014. Since then, perovskites have attracted increasing worldwide attention for a variety of optoelectronic fields, including solar cells, light-emitting diodes, and laser applications. However, the standard perovskite $MAPbI_3$ is found to have potential stability issues in moisture-containing environments, especially at elevated temperatures with exposure to light. Thus, improved perovskite halide films are needed for these materials to provide technically and economically viable solar cell alternatives to the current incumbent technologies such as silicon solar cells.

SUMMARY

An aspect of the present disclosure is a method that includes contacting an alkyl ammonium metal halide film with an alkyl ammonium halide, where the alkyl ammonium metal halide film includes a first halogen and a metal, the alkyl ammonium halide includes a second halogen, such that the contacting forms an alkyl ammonium metal mixed-halide film that interfaces with the alkyl ammonium metal halide film, where the alkyl ammonium metal mixed-halide film includes the first halogen, the second halogen, and the metal. In some embodiments of the present disclosure, during the contacting, the alkyl ammonium halide may be in at least one of a liquid phase and/or a vapor phase. In some embodiments of the present disclosure, the contacting may be in the liquid phase, and the liquid phase may be in a solution with a solvent. In some embodiments of the present disclosure, the metal may include at least one of lead, tin, and/or germanium.

In some embodiments of the present disclosure, the alkyl ammonium metal halide film may include $CH_3NH_3PbI_3$, the first halogen may include iodine, and the metal may include lead. In some embodiments of the present disclosure, the alkyl ammonium halide may include $CH_3NH_3Br$ (MABr), and the second halogen may include bromine. In some embodiments of the present disclosure, the alkyl ammonium metal halide film may be substantially insoluble in the solvent, and the alkyl ammonium halide may be substantially soluble in the solvent. In some embodiments of the present disclosure, the solvent may include at least one of isopropanol and/or tert-butanol. In some embodiments of the present disclosure, the alkyl ammonium metal mixed-halide film may include $CH_3NH_3PbI_{3-x}Br_x$, the first halogen may include iodine, the second halogen may include bromine, the metal may include lead, and x may be between greater than 0 and about 3.

In some embodiments of the present disclosure, the alkyl ammonium metal mixed-halide film may have a thickness between about 1 nanometer and about 1000 nanometers. In some embodiments of the present disclosure, the thickness may be between about 3 nanometers and about 300 nanometers. In some embodiments of the present disclosure, the method may further include heating the alkyl ammonium metal halide film and the alkyl ammonium metal mixed-halide film. In some embodiments of the present disclosure, the heating may include attaining an average bulk temperature for the alkyl ammonium metal halide film and the alkyl ammonium metal mixed-halide film between about 50° C. and about 300° C. In some embodiments of the present disclosure, the average bulk temperature may be between about 100° C. and about 150° C. In some embodiments of the present disclosure, the method may further include, before the contacting, depositing the alkyl ammonium metal halide film onto a substrate. In some embodiments of the present disclosure, the MABr may be in the solution at a concentration between greater than 0 mg MABr/ml to about 8 mg MABr/ml. In some embodiments of the present disclosure, the concentration may be between greater than 0 mg MABr/ml to about 2 mg MABr/ml.

An aspect of the present disclosure is a device that includes, in order, an alkyl ammonium metal halide film that includes a first halogen, and an alkyl ammonium metal mixed-halide film that includes the first halogen and a second halogen, where the alkyl ammonium metal halide film has a thickness of about 1 nanometer to about 1000 nanometers, and a thickness of the alkyl ammonium metal mixed-halide film is less than or equal to the thickness of the alkyl ammonium metal halide film. In some embodiments of the present disclosure, the thickness of the alkyl ammonium metal mixed-halide film may be between about 1 nanometer to about 1000 nanometers. In some embodiments of the present disclosure, the metal may include at least one of lead, tin, or germanium. In some embodiments of the present disclosure, the alkyl ammonium metal halide film may include $CH_3NH_3PbI_3$, the first halogen may include iodine, and the metal may include lead. In some embodiments of the present disclosure, the alkyl ammonium lead mixed-halide film may include $CH_3NH_3PbT_{3-x}Br_x$, the first halogen may include iodine, the second halogen may include bromine, the metal may include lead, and x may be between greater than 0 and about 3.

BRIEF DESCRIPTION OF THE DRAWINGS

Exemplary embodiments are illustrated in referenced figures of the drawings. It is intended that the embodiments and figures disclosed herein are to be considered illustrative rather than limiting.

(FIG. 7a) steady-state PL and (FIG. 7b) time-resolved PL spectra of $MAPbI_3$ films with and without MABr treatment.

(FIG. 14A) J-V curves, (FIG. 14B) EQE spectra, and (FIG. 14C) stabilized photocurrent density and power conversion efficiency biased near the maximum power point. 2 mg/mL MABr solution was used for the MABr treatment.

(FIG. 16A) XPS spectra of the Br 3d core-level region for $MAPbI_3$ thin films and those treated with low (2 mg/mL) and high (8 mg/mL) concentration MABr solutions. Top-view SEM images of (FIG. 16B) a high-quality $MAPbI_3$ thin film and those treated with 2 mg/mL (FIG. 16C) MABr and (FIG. 116D) MAI solutions.

Figure 1:
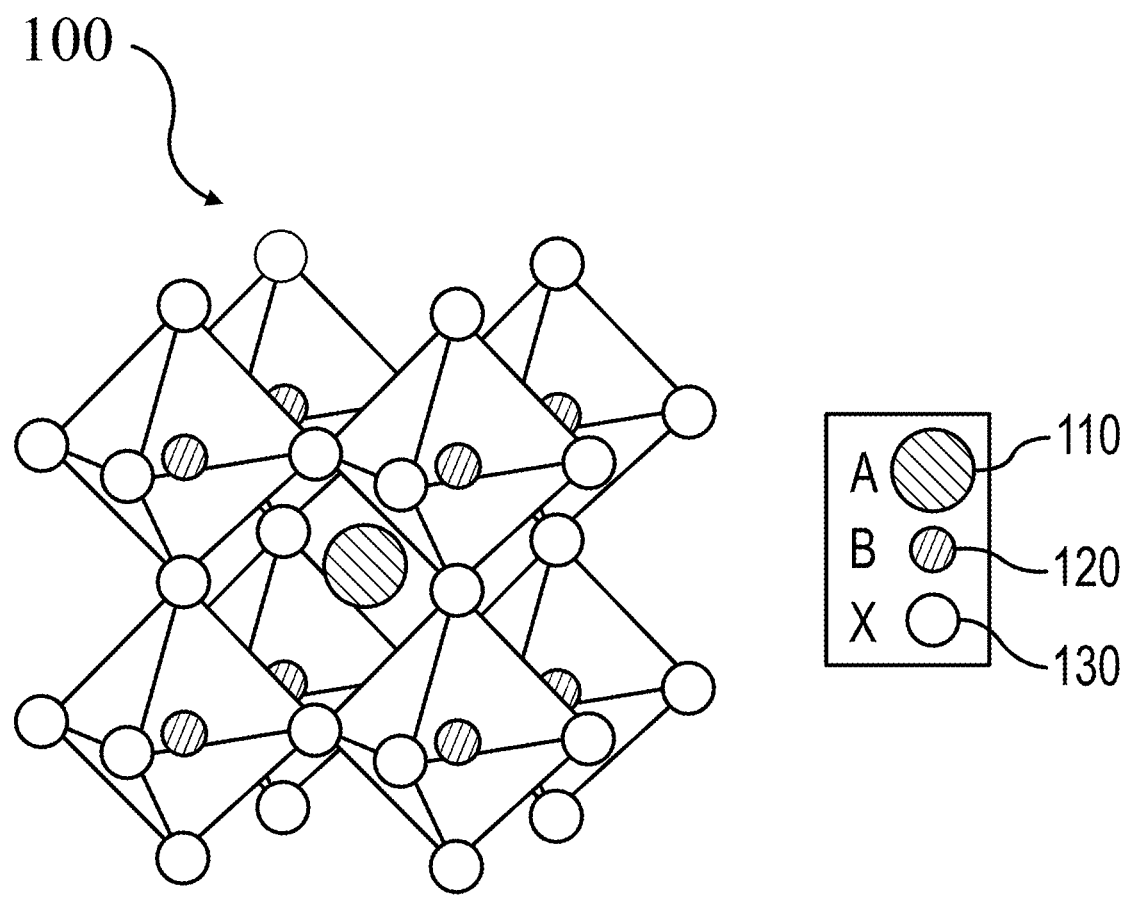
FIG. 1 illustrates a schematic of a perovskite material, according to some embodiments of the present disclosure.

REFERENCE NUMBERS 100 perovskite
110 cation
120 cation
200 method
210 substrate
215 raw materials
220 depositing
230 alkyl ammonium halide solution
235 contacting
245 heating
250 volatiles
255 multi-layered perovskite device
310 alkyl ammonium metal halide film
320 alkyl ammonium metal mixed-halide film
325 perovskite intermediate device
330 secondary alkyl ammonium metal mixed-halide film
355 final perovskite device

DETAILED DESCRIPTION

Some embodiments of the present disclosure relate to contacting the surface of a perovskite material, e.g. an alkyl ammonium metal halide film such as a methyl ammonium lead iodide ($MAPbI_3$) film with a solution of a solvent (e.g. isopropanol (IPA) and/or tert-butanol) containing an alkyl ammonium halide, e.g. methyl ammonium bromide (MABr), methylammonium iodide (MAI), methylammonium chloride (MACl), and/or formamidinium chloride (FACl). The contacting may be followed by heating (e.g., between about 50° C. to about 300° C. or between about 100° C. to about 150° C.), such that the contacting and/or the heating result in the formation of an alkyl ammonium metal mixed-halide film (for example a mixed halide perovskite film such as $MAPbI_{3-x}Br_x$, $MAPbI_{3-x}Cl_x$, and/or $MA_{1-y}FA_yPbI_{3-x}Cl_x$), positioned on the alkyl ammonium metal halide film and/or at least partially infiltrating into the alkyl ammonium metal halide film, where x may be any value between greater than 0 and about 3. In some embodiments of the present disclosure, such a film of $MAPbI_{3-x}Br_x$, or some other alkyl ammonium metal mixed-halide films, may extend from a few nanometers to a few hundred nanometers below the top surface of the alkyl ammonium metal halide film, or may extend from about one nanometer to about 1000 nanometers below the top surface of the alkyl ammonium metal halide film. In some embodiments of the present disclosure, an alkyl ammonium metal mixed-halide film may be positioned substantially on the alkyl ammonium metal halide film and have a thickness between about a few nanometers and about 1000 nanometers. For the example of bromine, the incorporation of bromine into the starting MAPbI$_3$ film (the starting alky ammonium metal halide film) and/or the creation of a separate MAPbI$_{3-x}$Br$_x$ film (the resultant alkyl ammonium metal mixed-halide film) on the starting MAPbI$_3$ film as a result of the MABr contacting and/or heating is evidenced by several elecro-optical and structural characterizations (see below). It will be shown herein that the MABr-treated perovskite device has much improved stability at elevated temperature (~100° C.) under light illumination. Moreover, it will be shown that device performance using MABr-treated perovskite films is much improved relative to the device performance of untreated MAPbI$_3$ films.

These findings support the concept that both solution (e.g. liquid) phase and/or vapor phase treatments of alkyl ammonium metal halide perovskite films, utilizing liquid- and/or vapor-phase alkyl ammonium halides may provide more stable and better performing perovskite devices. For example, a device having a first film of an alkyl ammonium metal halide may be contacted with an alkyl ammonium halide, where the alkyl ammonium metal halide has at least one halogen, and the alkyl ammonium halide has at least one halogen that is different from the halogen of the alkyl ammonium metal halide. The contacting may then result in the creation of a second film, an alkyl ammonium metal mixed-halide film, positioned on and/or incorporated into a top surface of the first film, where the second film includes at least one halogen from the first film and at least one halogen from the alkyl ammonium halide. Thus, the alkyl ammonium metal mixed-halide film may include two or more halogens, a mixed halide perovskite material, where the second film may be positioned on the first film and/or may be partially incorporated into a top surface of the first film.

Thus, the contacting may be achieved in some cases using solution methods. As used herein "film" and "layer" are interchangeable terms. In other examples, a bi-layer and/or multi-layer perovskite device may be achieved by a physical vapor deposition technique using different source materials. The resultant devices may have a relatively thin, bromine-rich outer film characterized by a wide band gap, such that the thin outer film may serve as a moisture-resistant film as well as an open-circuit voltage enhancer. In addition, the resultant device may have a thicker, bulk tri-iodide perovskite film/layer positioned below an outer film, which may possess excellent light absorber characteristics (e.g. narrow band gap). This gradient, bi-layer, and/or multi-layer structure may be implemented in a sandwiched and/or laminar structure (wide band gap films as top and bottom films), which may find applications in quantum wells for light-emitting diodes and other optoelectronic devices.

As described herein, an alkyl ammonium metal halide film and/or an alkyl ammonium metal mixed-halide film may be constructed from one more organo-metal halide perovskite materials. FIG. 1 illustrates that organo-metal halide perovskites may organize into cubic crystalline structures, as well as other crystalline structures such as tetragonal and orthorhombic, and may be described by the general formula ABX$_3$, where X (130) is an anion and A (110) and B (120) are cations, typically of different sizes (A typically larger than B). In a cubic unit cell, the B-cation 120 resides at the eight corners of a cube, while the A-cation 110 is located at the center of the cube and with 12 X-anions 130 centrally located between B-cations 120 along each edge of the unit cell. Typical inorganic perovskites include calcium titanium oxide (calcium titanate) minerals such as, for example, CaTiO$_3$ and SrTiO$_3$. In some embodiments of the present invention, the A cation 110 may include a nitrogen-containing organic compound such as an alkyl ammonium compound. A B-cation 120 may include a metal and an X-anion 130 may include a halide.

Additional examples for cation A (110) include organic cations and/or inorganic cations. Organic cations of A (110) may be an alkyl ammonium cation, for example a C$_{1-20}$ alkyl ammonium cation, a C$_{1-6}$ alkyl ammonium cation, a C$_{2-6}$ alkyl ammonium cation, a C$_{1-5}$ alkyl ammonium cation, a C$_{1-4}$ alkyl ammonium cation, a C$_{1-3}$ alkyl ammonium cation, a C$_{1-2}$ alkyl ammonium cation, and/or a C$_1$ alkyl ammonium cation. Further examples of organic cations of A (110) include methylammonium (CH$_3$NH$^{3+}$), ethylammonium (CH$_3$CH$_2$NH$^{3+}$), propylammonium (CH$_3$CH$_2$CH$_2$NH$^{3+}$), butylammonium (CH$_3$CH$_2$CH$_2$CH$_2$NH$^{3+}$), formamidinium (NH$_2$CH=NH$^{2+}$), and/or any other suitable nitrogen-containing organic compound. In other examples, a cation A (110) may include an alkylamine. Thus, a cation A (110) may include an organic component with one or more amine groups. For example, cation A (110) may be an alkyl diamine halide such as formamidinium (CH(NH$_2$)$_2$).

Examples of metal cations 120 include, for example, lead, tin, germanium, and or any other 2+ valence state metal that can charge-balance the organo-metal halide perovskite 100. Examples for the anion X (130) include halides: e.g. fluorine, chlorine, bromine, iodine and/or astatine. In some cases, the organo-metal halide perovskite may include more than one anion X (130), for example pairs of halides; chlorine and iodine, bromine and iodine, and/or any other suitable pairing of halides. In other cases, the organo-metal halide perovskite 100 may include two or more halides of fluorine, chlorine, bromine, iodine, and/or astatine.

Thus, cation A (110), cation B (120), and anion X (130) may be selected within the general formula of ABX$_3$ to produce a wide variety of organo-metal halide perovskite 100, including, for example, methylammonium lead triiodide (CH$_3$NH$_3$PbI$_3$), and mixed halogen perovskites such as CH$_3$NH$_3$PbI$_{3-x}$Cl$_x$ and CH$_3$NH$_3$PbI$_{3-x}$Br$_x$. Thus, an organo-metal halide perovskite 100 may have more than one halogen element, where the various halogen elements are present in non-integer quantities; e.g. x is not equal to 1, 2, or 3. In addition, organo-metal halide perovskite, like other perovskites, can form three-dimensional (3-D), two-dimensional (2-D), one-dimensional (1-D) or zero-dimensional (0-D) networks, possessing the same unit structure.

As stated above, the anion A (110) may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl (C$_1$), ethyl (C$_2$), n-propyl (C$_3$), isopropyl (C$_3$), n-butyl (C$_4$), tert-butyl (C$_4$), sec-butyl (C$_4$), iso-butyl (C$_4$), n-pentyl (C$_5$), 3-pentanyl (C$_5$), amyl (C$_5$), neopentyl (C$_5$), 3-methyl-2-butanyl (C$_5$), tertiary amyl (C$_5$), and n-hexyl (C$_6$). Additional examples of alkyl groups include n-heptyl (C$_7$), n-octyl (C$_8$) and the like.

Figure 2:
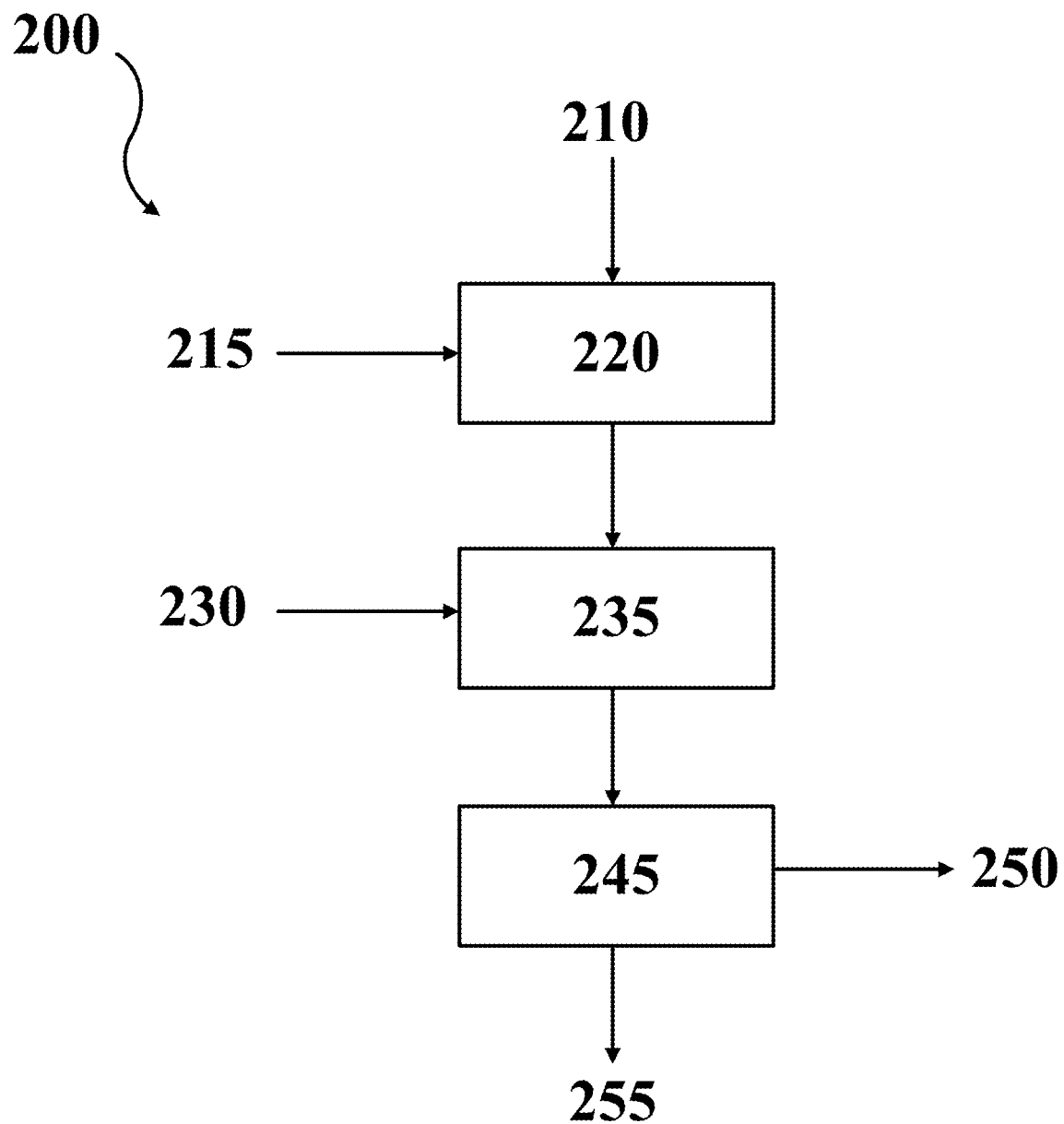
FIG. 2 illustrates a method of making a perovskite device, according to some embodiments of the present disclosure.

FIG. 2 illustrates an example of a method 200 for producing a multi-layered perovskite device 255. The method 200 begins with depositing 220 an alkyl ammonium metal halide film onto a substrate 210. The depositing 220 of the alkyl ammonium metal halide film may be performed by one or more solution methods and/or by one or more vapor deposition methods that provide the required raw materials 215 (e.g. a metal halide, an alkyl ammonium halide, etc.). The alkyl ammonium metal halide film may be any alkyl ammonium metal halide such as a $CH_3NH_3PbI_3$ film. Thus, for the example of $CH_3NH_3PbI_3$, the alkyl is a methyl group, the metal is lead, and the halide is the halogen element iodine. In other examples, the metal may be lead, tin, and/or germanium. In other examples, the alkyl ammonium metal halide film may have an alkyl group that is a methyl group, a propyl group, and/or a butyl group. In other examples, the alkyl ammonium metal halide film may have a halogen that is iodine, bromine, and/or chlorine.

The deposited alkyl ammonium metal halide film may be modified by contacting 235 the alkyl ammonium metal halide film with an alkyl ammonium halide in a liquid solution 230. For example, the alkyl ammonium halide solution 230 may include an alkyl ammonium halide at least partially dissolved in a solvent. The alkyl ammonium halide in the solution may be a compound that contains a different halogen from the halogen present in the alkyl ammonium metal halide film formed by the depositing 220. The solvent used to formulate the alkyl ammonium halide solution 230 may be any solvent with a high solubility for the alkyl ammonium halide, while also having a low solubility for the alkyl ammonium metal halide film. The contacting 235 may modify a top portion of the alkyl ammonium metal halide film, such that an alkyl ammonium metal mixed-halide film forms within a top portion of the alkyl ammonium metal halide film, where the alkyl ammonium metal mixed-halide film includes a first halogen from the alkyl ammonium metal halide film, and a second halogen from the alkyl ammonium halide solution 230. Alternatively, the contacting 235 may deposit an alkyl ammonium metal mixed-halide film on top of the alkyl ammonium metal halide film, where the alkyl ammonium metal mixed-halide film may include the first halogen from the first alkyl ammonium metal halide film, and the second halogen from the alkyl ammonium halide solution 230. Alternatively, the contacting 235 may both modify a top portion of the alkyl ammonium metal halide film and deposit a thin alkyl ammonium metal mixed-halide film on top of the alkyl ammonium metal halide film. The modifying and depositing may together create a composite film of an alkyl ammonium metal mixed-halide film positioned on top of an alkyl ammonium metal halide film, where the alkyl ammonium metal mixed-halide film also penetrates into a portion of the top surface of the alkyl ammonium metal halide film, and where the composite film includes the first halogen from the alkyl ammonium metal halide film, and the second halogen from the alkyl ammonium halide solution 230. The contacting 235 may be by a solution method such as dip coating, spin coating, curtain coating, spraying, microgravure, and/or slot-die coating. Alternatively or in addition to, the contacting 235 may be accomplished by one or more vapor deposition methods.

The contacting 235 may be conducted at a temperature between about room temperature to about 200° C. The concentration of the alkyl ammonium halide solution 230 may be between about 3 mM and about 300 mM. The contacting 235 may be conducted in air or in an inert atmosphere for a duration between about 2 seconds and about 300 seconds. The contacting 235 may be conducted in air or in an inert atmosphere for a duration between about 2 seconds and about 30 seconds.

The first multi-layered perovskite device, as described above, may be further processed by heating 245. The heating 245 may remove volatiles 250, resulting in a second multi-layered perovskite device 255. In some embodiments, the contacting 235 and the heating 245 may be performed simultaneously. The heating 245 may allow for more complete formation/growth of the alkyl ammonium metal mixed-halide film on and/or within a top portion of the underlying alkyl ammonium metal halide film. In addition, the heating 245 may provide control over the thickness of the alkyl ammonium metal mixed-halide film. In some embodiments of the present disclosure, the first multi-layered perovskite device and/or the second multi-layered perovskite device 255 may have an alkyl ammonium metal halide film with a thickness between about 1 nm to about 1000 nm, and an alkyl ammonium metal mixed-halide film positioned with a thickness between about 1 nm to about 1000 nm, or in some embodiments between about 3 nm to about 300 nm, where the alkyl ammonium metal mixed-halide film is positioned on the alkyl ammonium metal halide film. The heating 245 may be conducted at or slightly above room temperature up to about 200° C., for a duration between about a few minutes (e.g., 5 minutes) and about several hours (e.g., 5 hours).

Figure 3A:
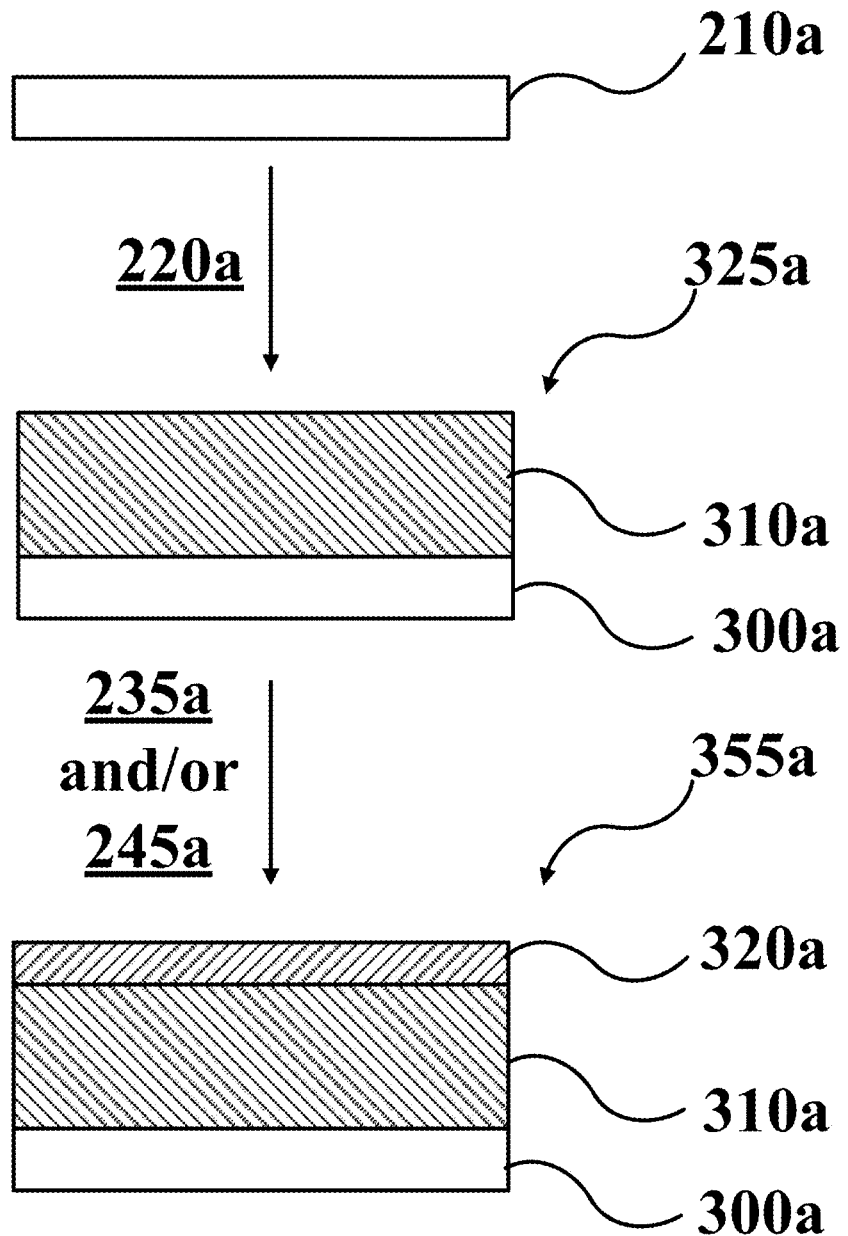
FIGS. 3A and 3B illustrate a perovskite device having two perovskite films, according to some embodiments of the present disclosure.
Figure 3B:
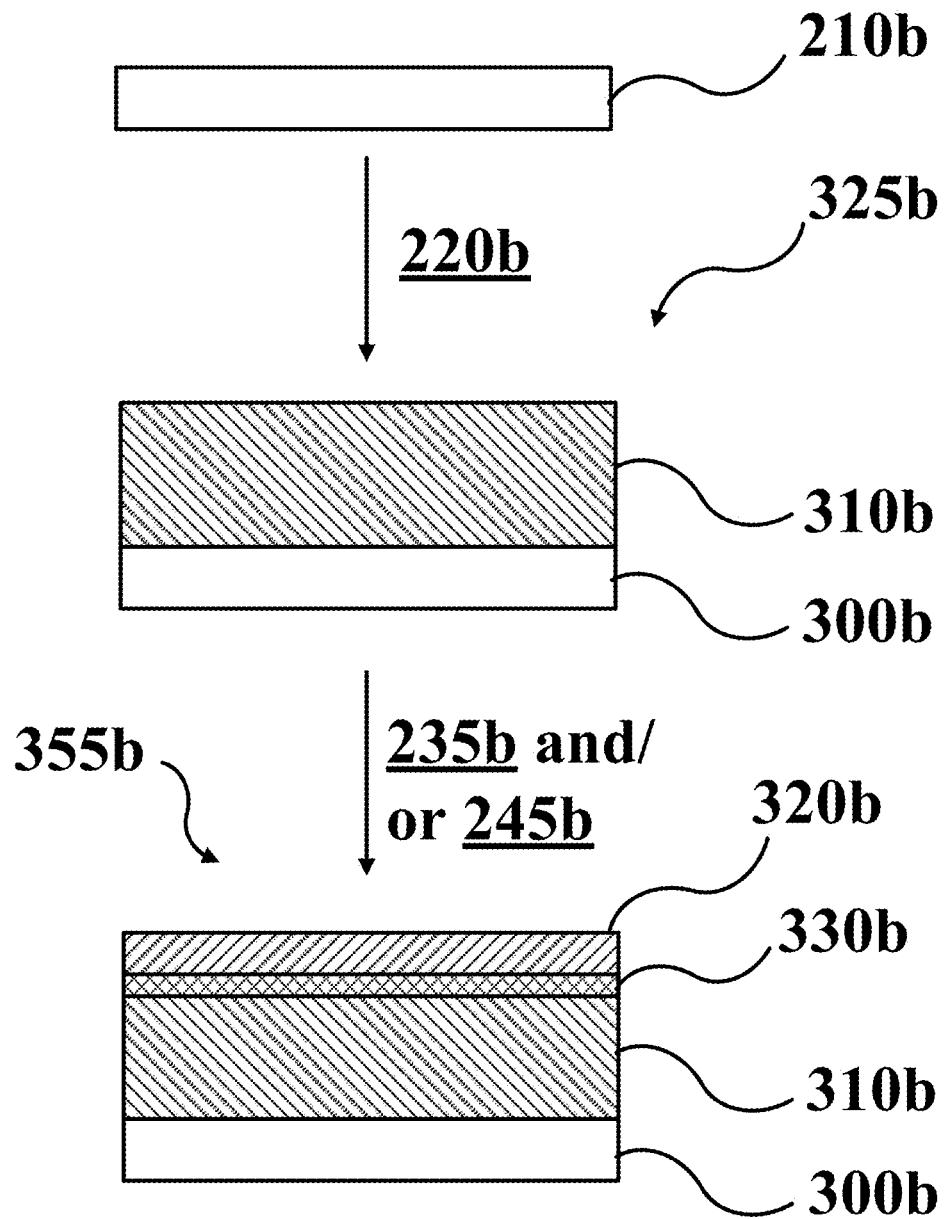

FIGS. 3A and 3B illustrate some embodiments of structures that may result from the methods described above. FIGS. 3A and 3B illustrate exemplary perovskite intermediate devices (325a and 325b) that may result from depositing (220a and 220b) alkyl ammonium metal halide films (310a and 310b) onto substrates (210a and 210b), as described above. Both perovskite intermediate devices (325a and 325b) include an alkyl ammonium metal halide film (310a and 310b) positioned on a top surface of the substrate (210a and 210b). However, the final multi-layered perovskite devices (355a and 355b) of FIGS. 3A and 3B resulting from the contacting (235a and 235b) and the optional heating (245a and 245b) described above for FIG. 2 may be different. In FIG. 3A, the final multi-layered perovskite device 355a includes an alkyl ammonium metal mixed-halide film 320a positioned on a top surface of an alkyl ammonium metal halide film 310a. Thus, the alkyl ammonium metal halide film 310a and the alkyl ammonium metal mixed-halide film 320a may be substantially separate and distinct films that share an interface between them. In FIG. 3B, the final multi-layered perovskite device 355b includes an alkyl ammonium metal mixed-halide film 320b positioned above an alkyl ammonium metal halide 310b. However, in addition, the final multi-layered perovskite device 355b of FIG. 3B includes a secondary alkyl ammonium metal mixed-halide film 330 positioned between the alkyl ammonium metal halide film 310 and the alkyl ammonium metal mixed-halide film 320. Thus, FIG. 3B illustrates an example where the final multi-layered perovskite device 355b results from a portion of a top thickness and the top surface of a first deposited alkyl ammonium metal halide film 310 being converted to the secondary alkyl ammonium metal mixed-halide film 330, with the additional formation of an alkyl ammonium metal mixed-halide film 320 on top of the newly converted secondary alkyl ammonium metal mixed-halide film 330.

In some embodiments of the present disclosure, an alkyl ammonium metal mixed-halide film 320 may result substantially entirely from the conversion of a top thickness and the top surface of the originally deposited alkyl ammonium metal halide film 310. Thus, most if not all of the alkyl ammonium metal mixed-halide film 320 may not result from the deposition of a new film on top of the originally deposited alkyl ammonium metal halide film 310. Instead, substantially all of the alkyl ammonium metal mixed-halide film 320 may originate from the originally deposited alkyl ammonium metal halide film 310. Without wishing to be bound by theory, there may be a strong driving force to mix at least a portion of an alkyl ammonium metal mixed-halide film 320 with at least a portion of an alkyl ammonium metal halide film 310; e.g. due to concentration gradients and/or thermal stimulus.

EXAMPLES

Experimental: Fluorine-doped tin oxide (FTO, TEC15, Hartford, Ind.) was patterned through a wet-etching method ($H_2$ evolution reaction between zinc powder and hydrochloric acid), followed by an overnight base bath soaking (5 wt % NaOH in ethanol). A compact $TiO_2$ (c-$TiO_2$) layer was deposited by a spray pyrolysis of 0.2 M titanium diisopropoxide bis(acetylacetonate) in 1-butanol solution at 450° C. $CH_3NH_3PbI_3$ (or $MAPbI_3$) film was fabricated on top of c-$TiO_2$/FTO using a modified solvent engineering method. Precursor was made of 44 wt % of equimolar ratio of methyl ammonium iodide (MAI) and $PbI_2$ in γ-butyrolactone (GBL, Sigma-Aldrich)/dimethyl sulfoxide (DMSO, Sigma-Aldrich) (7/3 v/v). Substrate was span at 3500 rpm for 50 seconds, and a stream of toluene was injected during the spinning. The $CH_3NH_3PbI_3$ perovskite film (e.g. the alkyl ammonium metal halide film) was fully crystallized by annealing at 85° C. for 10 minutes. For MABr treatment (e.g. the alkyl ammonium halide solution), 160 ul MABr in 2-propanol solution (2 mg/ml) was dispersed on top of the first perovskite film during 4000 rpm spinning. A thermal annealing of 150° C. for 10 minutes was processed to remove the solvent and incorporate MABr into and/or onto the first perovskite film. Hole transport material (HTM) was deposited on top of perovskite film by 4000 rpm for 30 seconds using 2,2',7,7'-tetrakis(N,N-dip-methoxyphenylamine)-9,9'-spirobifluorene (Spiro-OMeTAD, Merck) solution, which includes of 80 mg Spiro-OMeTAD, 30 μl bis(trifluoromethane) sulfonimide lithium salt (Li-TFSI) stock solution (500 mg Li-TFSI in 1 ml acetonitrile), 30 μl 4-tert-butylpyridine (TBP), and 1 ml chlorobenzene. Finally 150 nm Ag film was evaporated as a counter electrode using a shadow mask.

The J-V characteristics of the cells were obtained using a 2400 SourceMeter (Keithley) under simulated one-sun AM 1.5G illumination (100 mW cm$^{-2}$) (Oriel Sol3A Class AAA Solar Simulator, Newport Corporation). A 0.12-cm$^2$ non-reflective mask was used to define the active area. External quantum efficiency was measured using a solar cell quantum efficiency measurement system (QEX10, PV Measurements). Stabilized power output was monitored by a potentiostat (VersaSTAT MC, Princeton Applied Research) near a maximum power output point. X-ray diffraction of the perovskite thin films was performed using a X-ray diffractometer (Rigaku D/Max 2200) with Cu Kα radiation. Absorption spectra were carried out by a ultraviolet-visible (UV/vis) spectrometer (Cary-6000i).

X-ray photoemission spectroscopy measurements were performed on a Kratos NOVA spectrometer calibrated to the Fermi edge and core-level positions of sputter-cleaned metal (Au, Ag, Cu, Mo) surfaces. XPS spectra were taken using monochromated Al Kα radiation (1486.7 eV) at a resolution of 400 meV and fit using Pseudo-Voigt profiles.

Figure 4A:
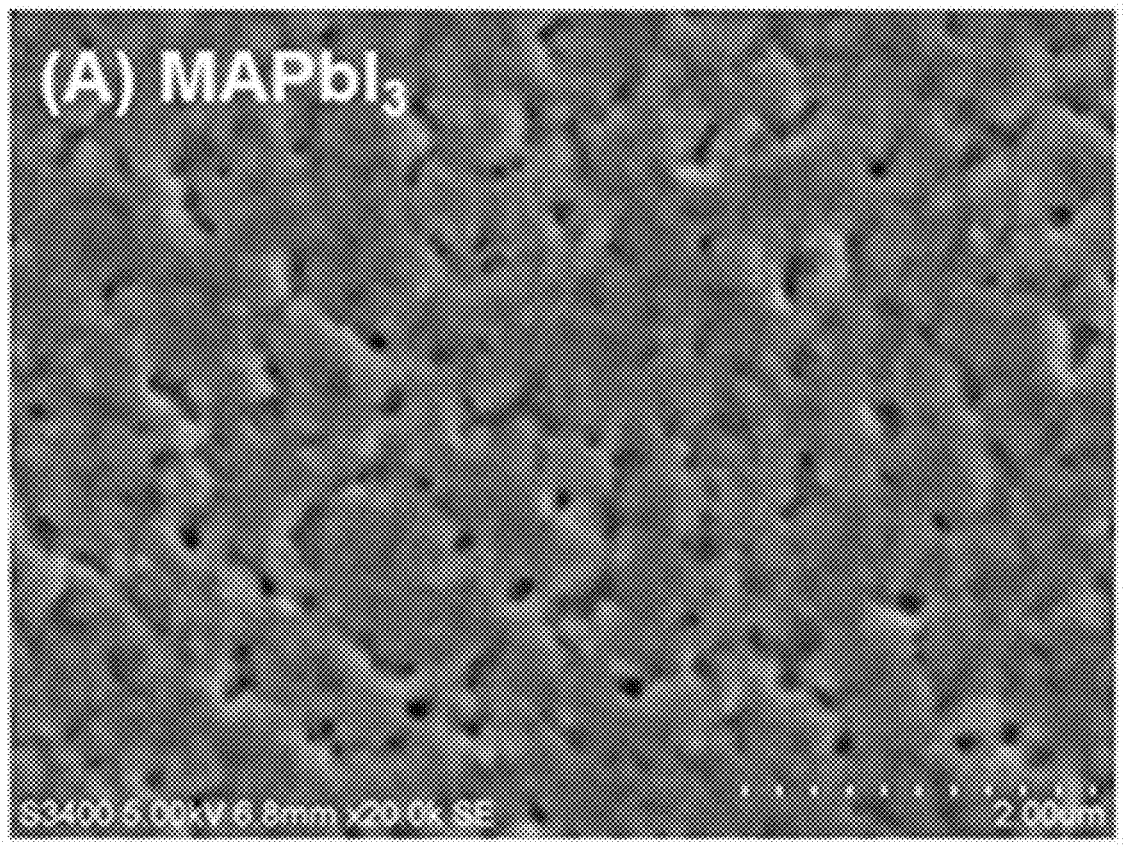
FIGS. 4A and 4B illustrate scanning electron microscopy (SEM) images of the top view of a (FIG. 4A) standard $MAPbI_3$ film and (FIG. 4B) MABr treated $MAPbI_3$ film made by methods according to some embodiments of the present disclosure.
Figure 4B:
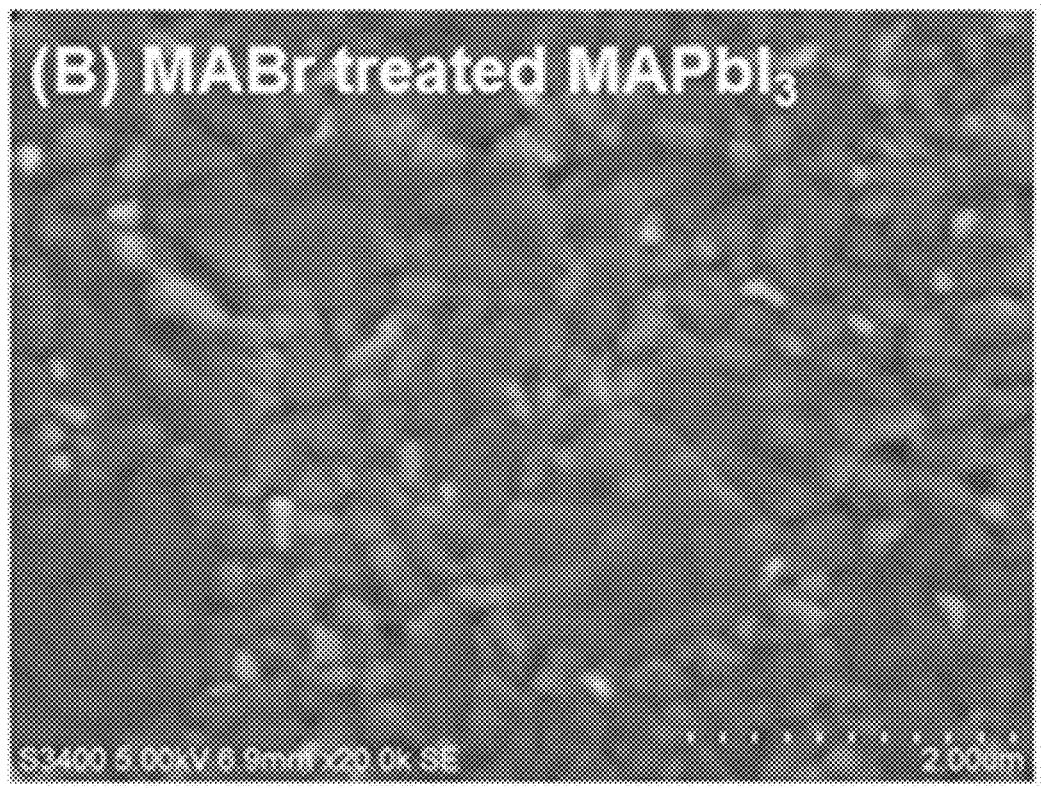

Results: FIGS. 4A and 4B illustrate scanning electron microscopy (SEM) images of the top view of the (FIG. 4A) first deposited $MAPbI_3$ film and (FIG. 4B) the MABr treated $MAPbI_3$ film. The grain size for the first deposited $MAPbI_3$ film is generally smaller than 500 nm, and a noticeable amount of pinholes can be observed. The MABr treatment not only eliminates those pinholes, it also increases the apparent grain size to 1-2 micrometer level.

Figure 5:
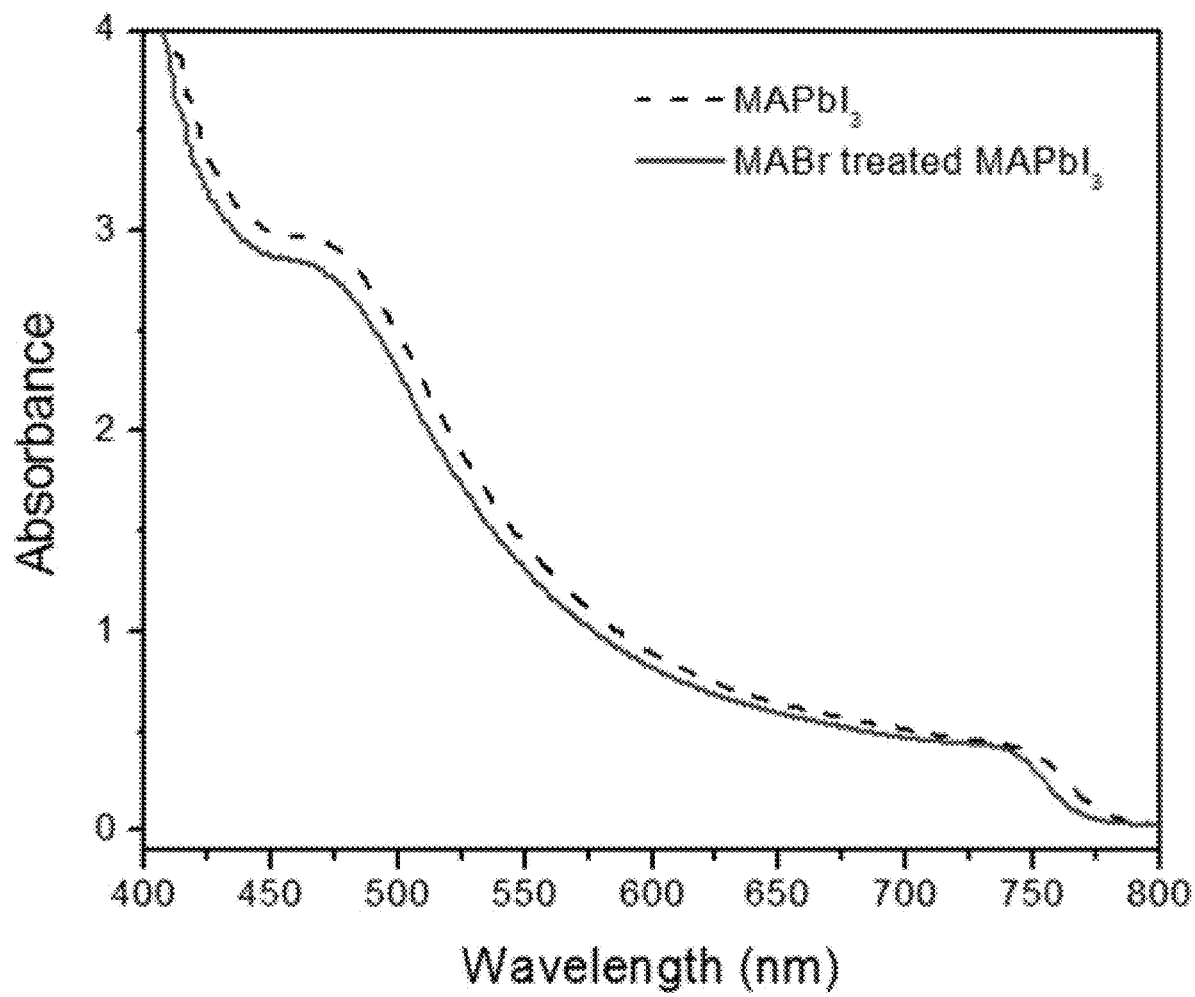
FIG. 5 illustrates ultraviolet-visible (UV-vis) absorption spectra of $MAPbI_3$ films with and without MABr treatment made by methods according to some embodiments of the present disclosure.

FIG. 5 illustrates ultraviolet-visible (UV-vis) absorption spectra of first deposited $MAPbI_3$ films with and without the MABr treatment. The MABr treatment blue shifts the absorption edge by about 10 nm. This slight spectral shift indicates the low-degree of incorporation of Br into the $MAPbI_3$. This implies that the MABr-treated $MAPbI_3$ sample contains $MAPbI_{3-x}Br_x$ (e.g. the alkyl ammonium metal mixed-halide). For reference, $MAPbI_2Br$ is expected to blue shift the absorption spectrum by about 100 nm relative to that of the standard $MAPbI_3$ sample. It is worth noting that the MABr-treated sample has essentially the same absorbance intensity as the one without MABr treatment.

Figure 6:
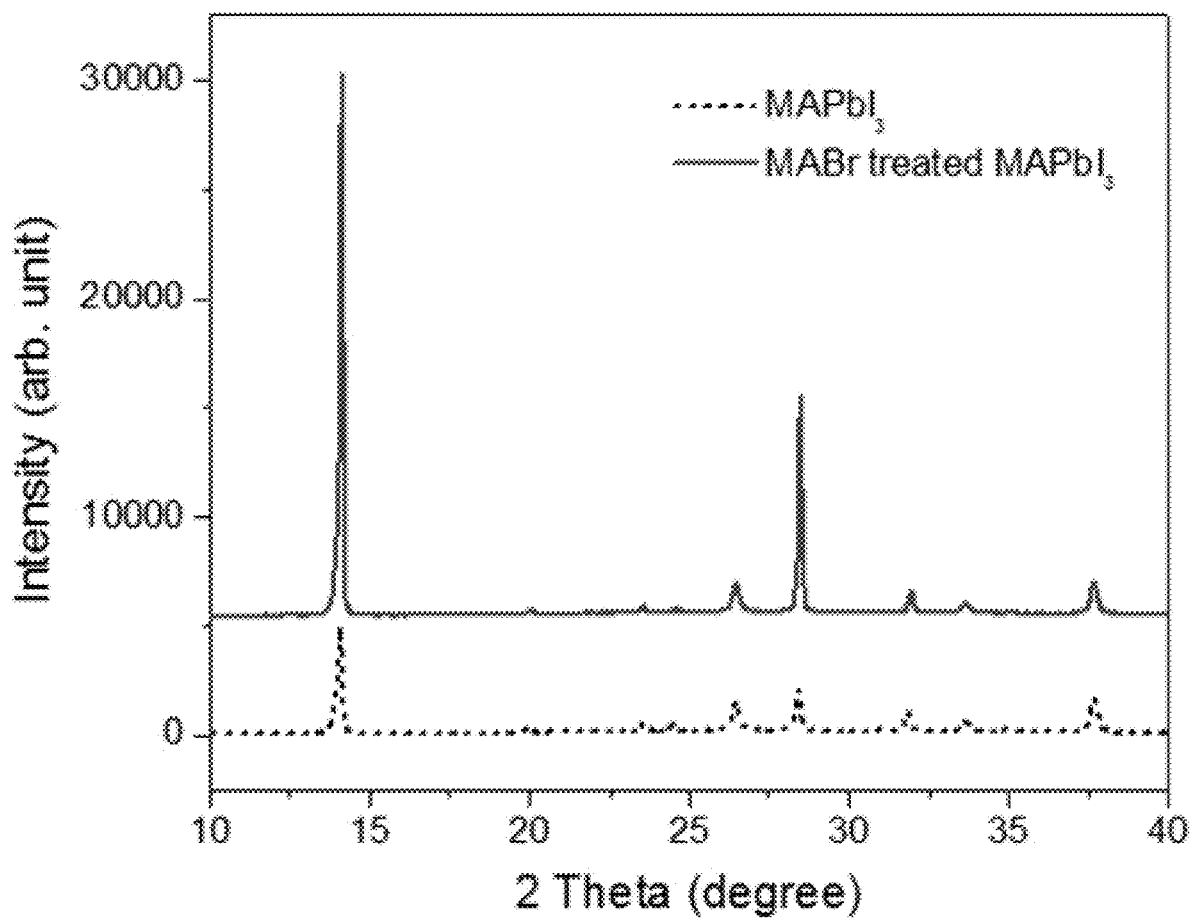
FIG. 6 illustrates X-ray diffraction patterns of $MAPbI_3$ films with and without MABr treatment made by methods according to some embodiments of the present disclosure.
Figure 7A:
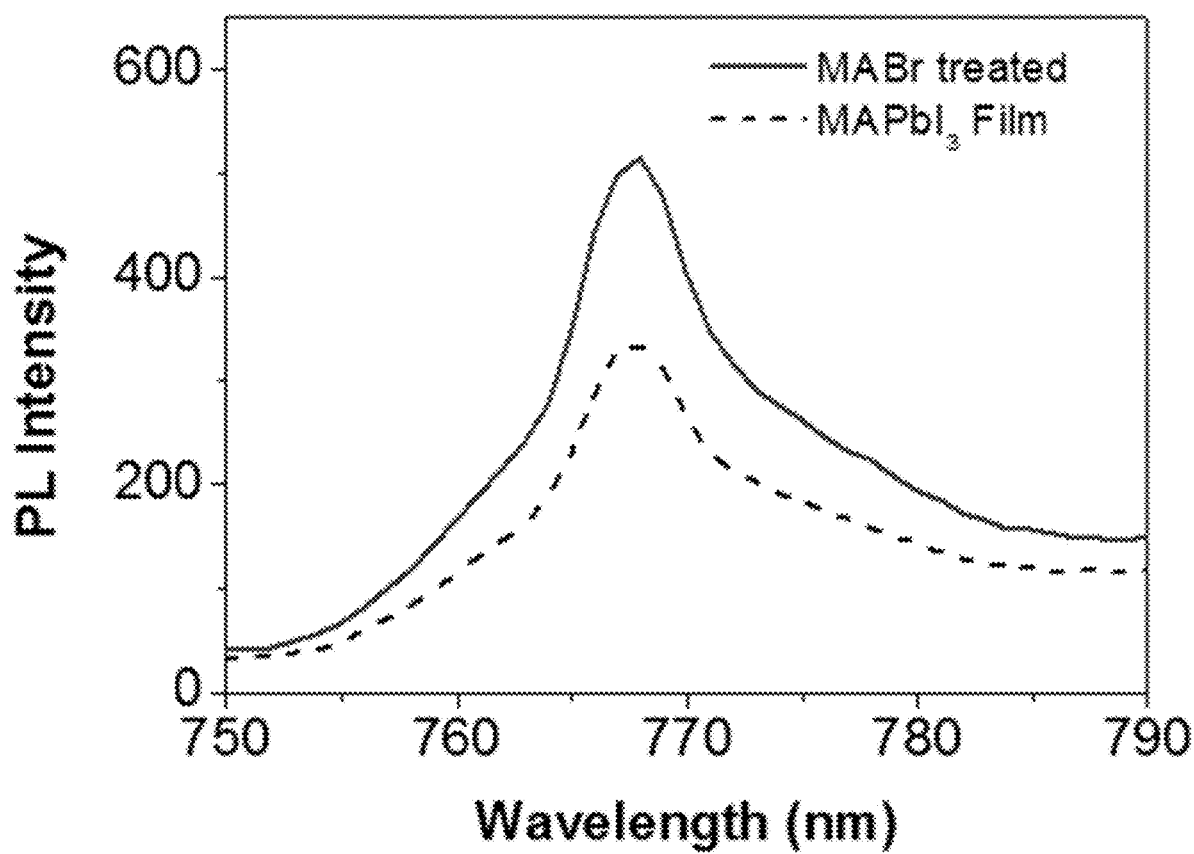
FIGS. 7A and 7B illustrate the impact of MABr treatment on the photoluminescence (PL) properties of a starting $MAPbI_3$ thin film, according to some embodiments of the present disclosure.
Figure 7B:
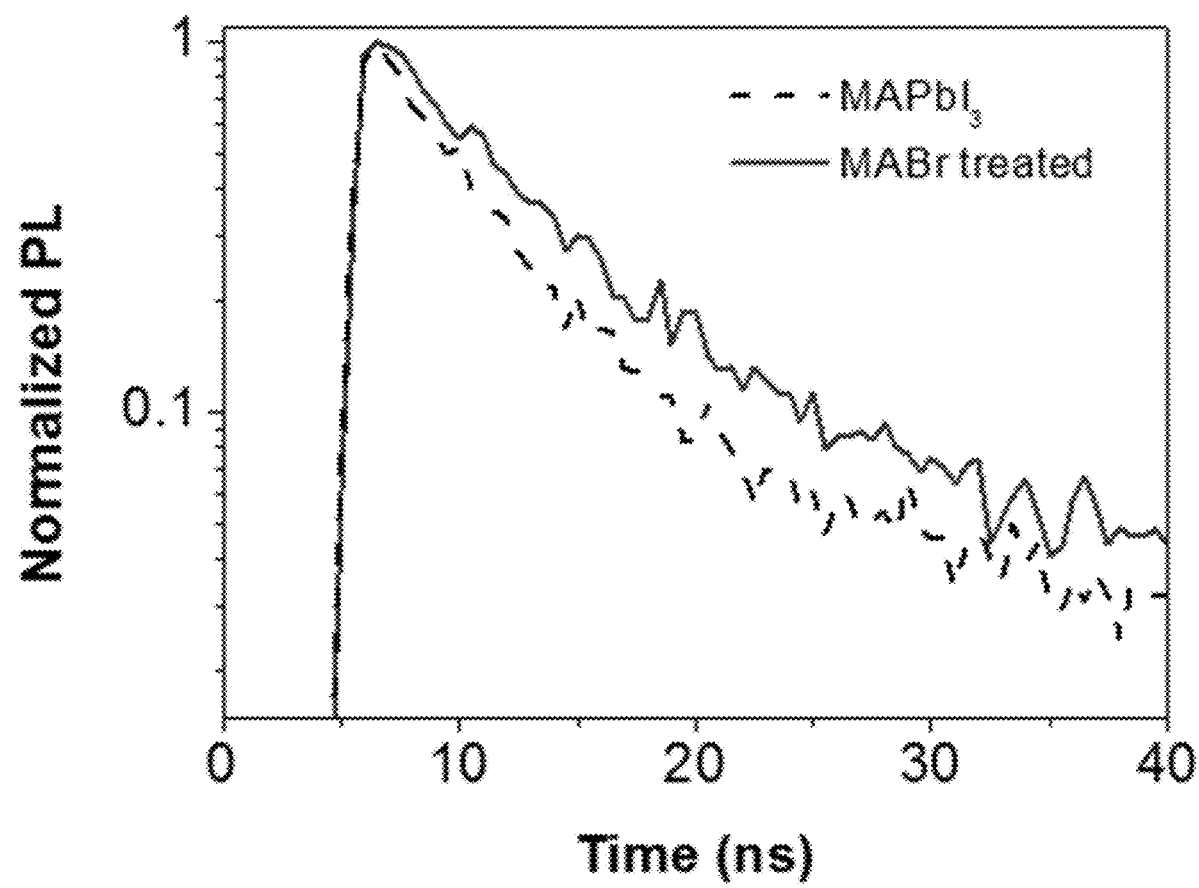

FIG. 6 illustrates X-ray diffraction patterns of the first deposited $MAPbI_3$ films with and without MABr treatment. The main characteristic perovskite peak around 14 degree increases by about a factor of five after the MABr treatment, indicating enhanced crystallinity. This observation is consistent with the larger average grain size for the MABr-treated film shown in FIGS. 4A and 4B. It is noted that the $MAPbI_3$ film treated with the MABr solution film exhibits a longer photoluminescence decay time (see FIGS. 7A and 7B) than the starting $MAPbI_3$ film sample, indicating a passivation effect with the MABr treatment that could be associated with the overall improvements in the $MAPbI_{3-x}Br_x$ film quality.

Figure 8:
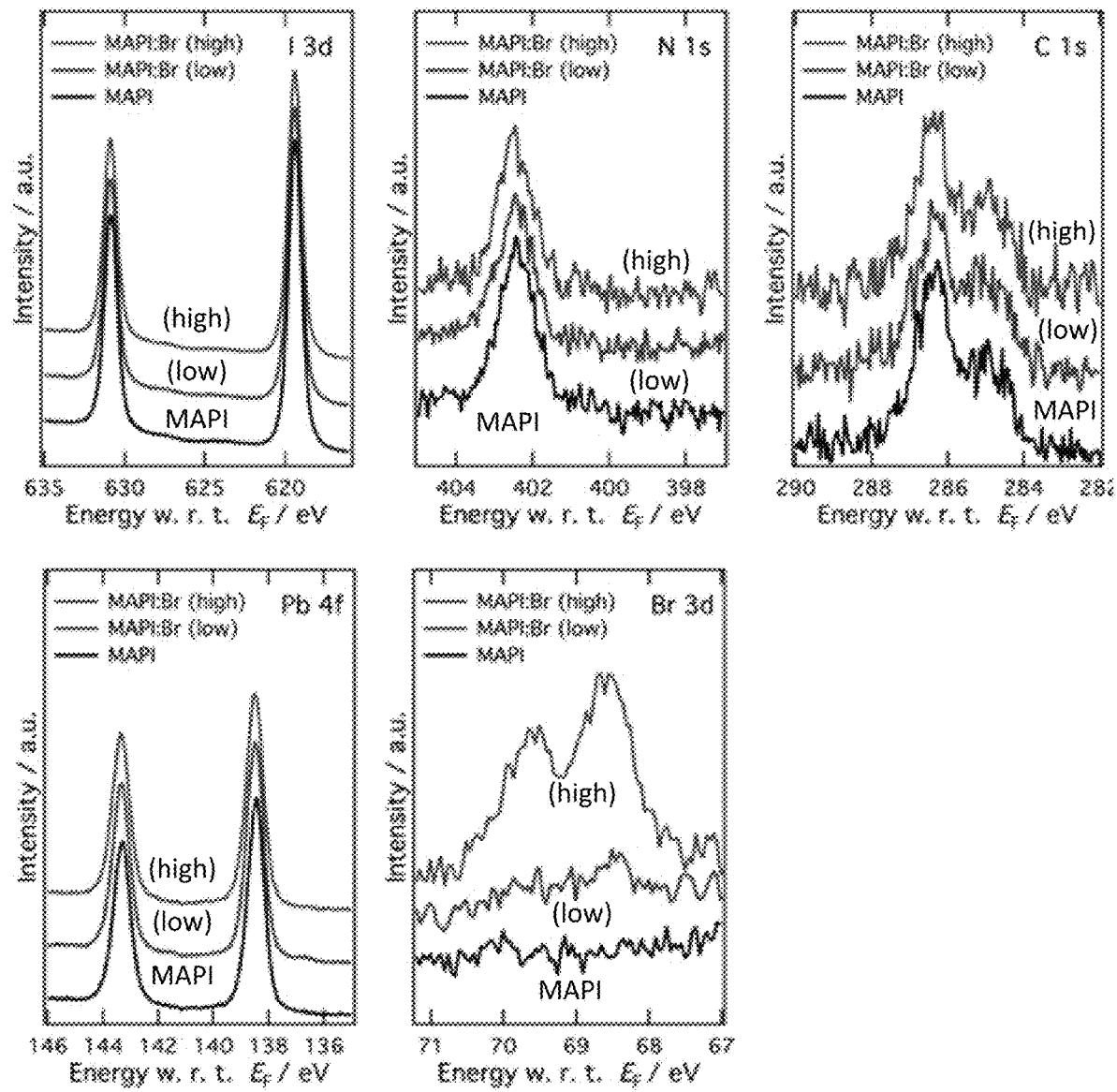
FIG. 8 illustrates X-ray photoelectron spectroscopy (XPS) measurements of core level analysis of $MAPbI_3$ with and without MABr treatment, according to some embodiments of the present disclosure.

FIG. 8 illustrates x-ray photoelectron spectroscopy (XPS) measurements of core level analysis of $MAPbI_3$ with and without MABr treatment. In addition to the strong I 3d signal for all samples, there is a clear Br 3d signal for the MABr treated films, especially for the film treated with a higher MABr concentration (~10 mg/ml). The lower concentration (~2 mg/ml), which is used for other measurement, also has a clear but much weaker Br 3d signal.

Figure 9:
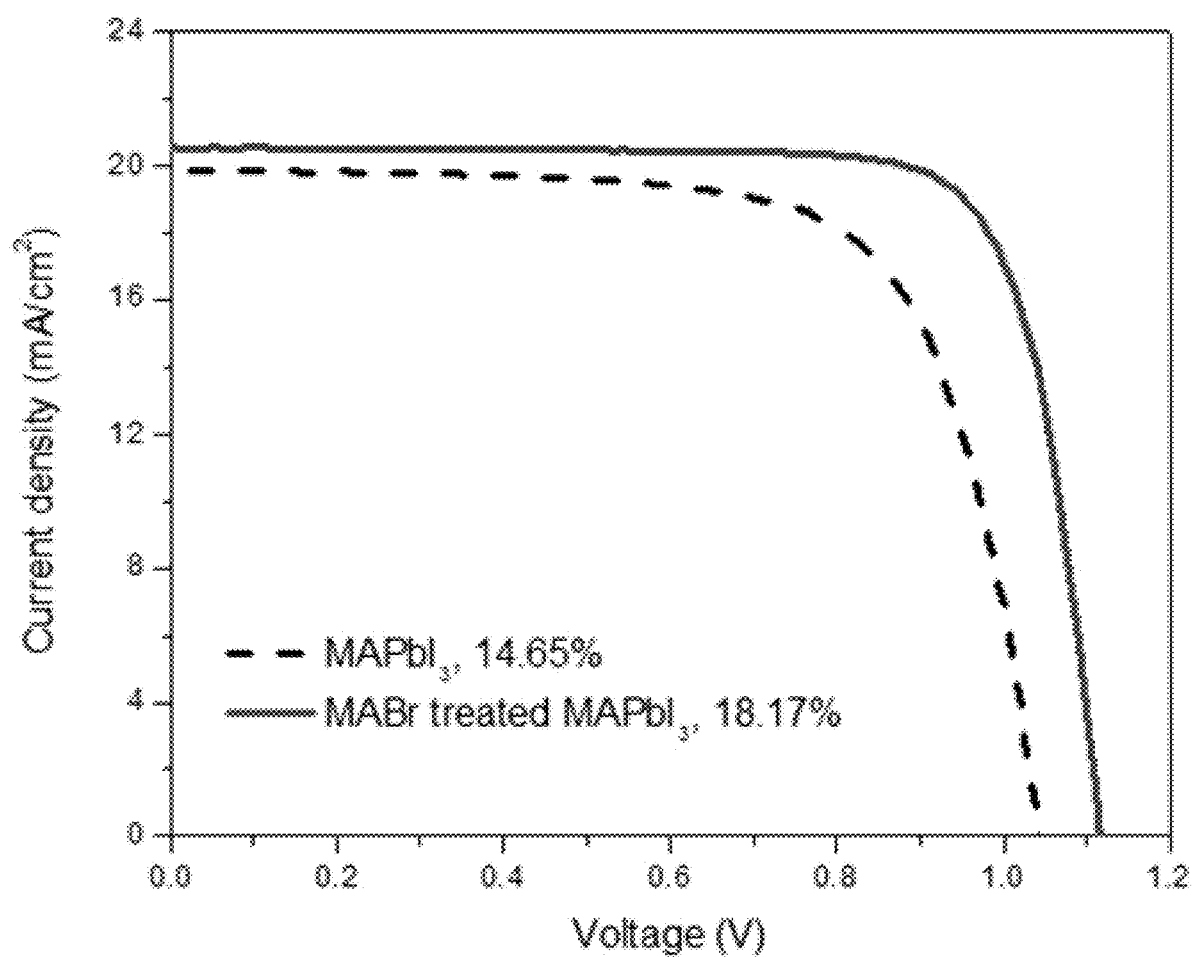
FIG. 9 illustrates photocurrent density-voltage (J-V) curves of perovskite solar cells based on films of $MAPbI_3$ with and without MABr treatment, according to some embodiments of the present disclosure.

FIG. 9 illustrates shows the typical photocurrent density-voltage (J-V) curves of the $MAPbI_3$- and $MAPbI_{3-x}Br_x$-based solar cells. It is noteworthy that for these devices the initial $MAPbI_3$ films have mediocre (relatively poor) film quality as shown in FIGS. 4A and 4B. However, a substantial performance improvement was obtained by treating the initial $MAPbI_3$ with a MABr solution. The $MAPbI_3$-based PSC shows about 14.65% power conversion efficiency (PCE) with a short-circuit photocurrent density ($J_{sc}$) of 19.93 mA/cm$^2$, open-circuit voltage ($V_{oc}$) of 1.042 V, and fill factor (FF) of 0.705. With the 2 mg/mL MABr treatment, the device performance for $MAPbI_{3-x}Br_x$-based PSC increases to 17.38% with a $J_{sc}$ of 20.68 mA/cm$^2$, $V_{oc}$ of 1.092 V, and FF of 0.770. The improved device performance with all photovoltaic parameters is consistent with the improved structural and electro-optical properties (e.g., higher crystallinity, larger grain size, and fewer surface defects) of $MAPbI_{3-x}Br_x$ films in comparison to the pristine $MAPbI_3$ films.

Figure 10:
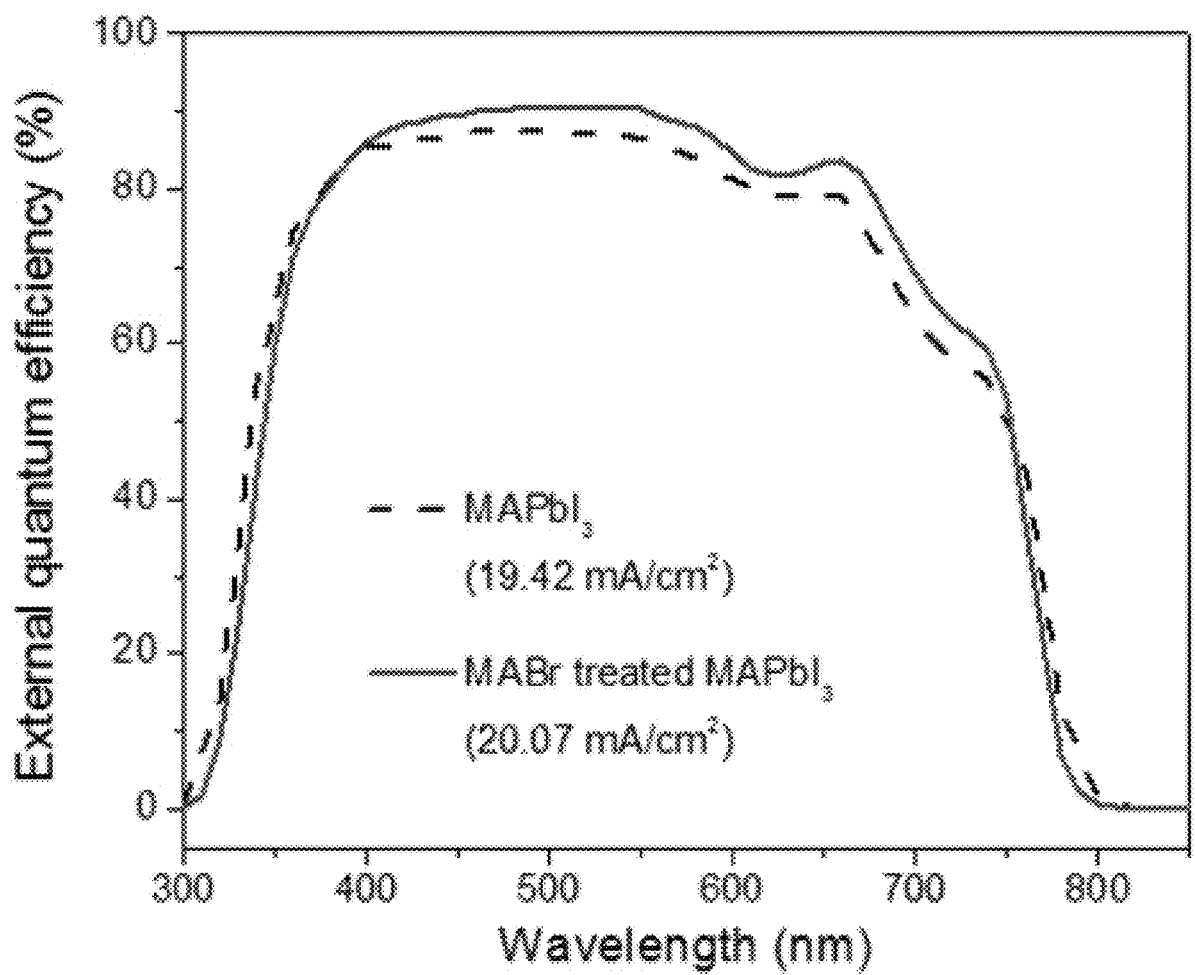
FIG. 10 illustrates external quantum efficiency (EQE) spectra of solar cells based on $MAPbI_3$ and MABr-treated perovskite films made by methods according to some embodiments of the present disclosure.
Figures 11A, 11B:
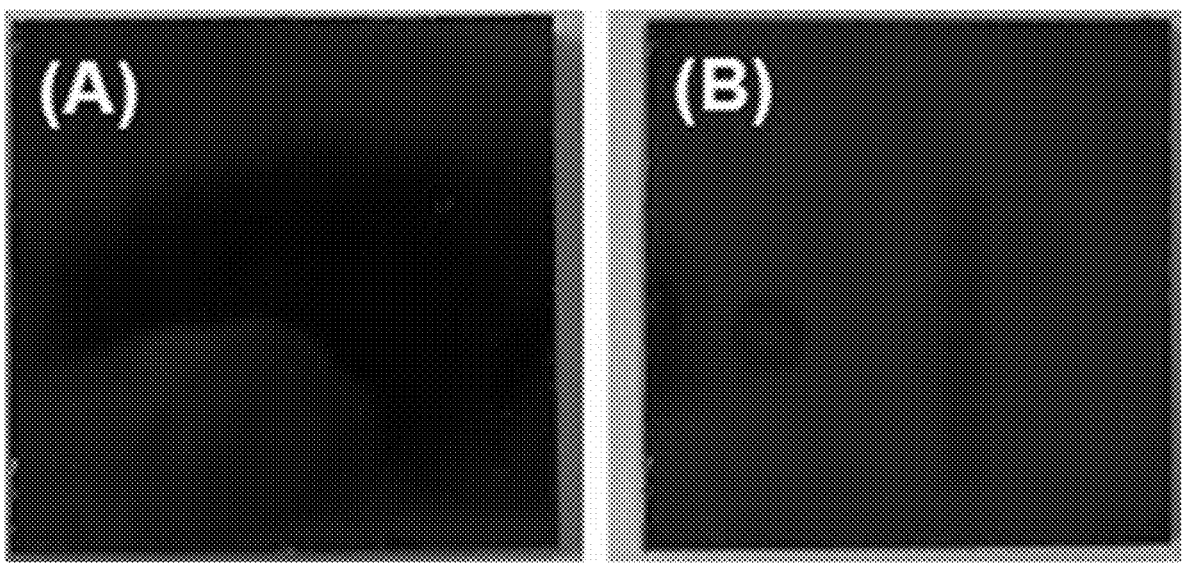
FIGS. 11A-D illustrate photos of as-prepared (FIG. 11A) and aged (FIG. 11C) $MAPbI_3$ film and as-prepared (FIG. 11B) and aged (FIG. 11D) MABr-treated $MAPbI_3$ film made by methods according to some embodiments of the present disclosure.
Figure 11C:
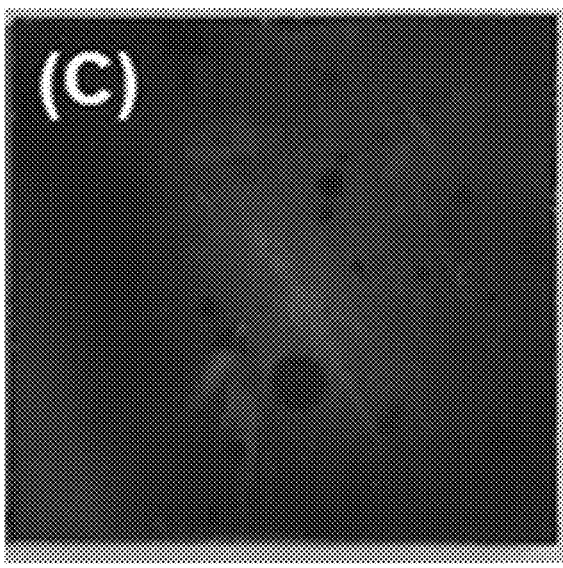
Figure 11D:
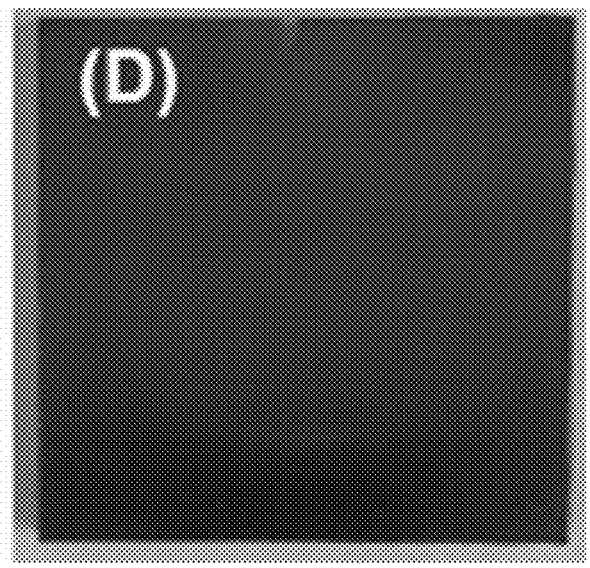

FIG. 10 illustrates external quantum efficiency (EQE) spectra of solar cells based on $MAPbI_3$ films and $MAPbI_3$ films that were MABr-treated. The spectral shift near the EQE onset around 800 nm is consistent with the observed blue shift in the absorption spectra in FIG. 5. The MABr-treated sample shows higher efficiency values across a wide spectral range despite their similar absorbance values in this spectral range. This indicates that the MABr treatment also improves charge-separation and/or charge-collection processes. Thus, besides the higher PV performance in efficiency, the MAPbI$_{3-x}$Br$_x$ films resulting from treating the starting MAPbI$_3$ films with a MABr solution also exhibit enhanced stability.

FIGS. 11A-D illustrate photos of an as-prepared (FIG. 11A) MAPbI$_3$ film and (FIG. 11B) a MABr-treated MAPbI$_3$ film. Photos of (FIG. 11C) MAPbI$_3$ film and (FIG. 11D) MABr-treated MAPbI$_3$ film after annealing at 95° on a hotplate in humid air (60% relative humidity) for 15 hours. The yellowing shown in (FIG. 11D) is clear indication of decomposition of the MAPbI$_3$ film. In contrast, the MABr-treated film in (FIG. 11C) shows much improved thermal stability in humidity air.

Figure 12:
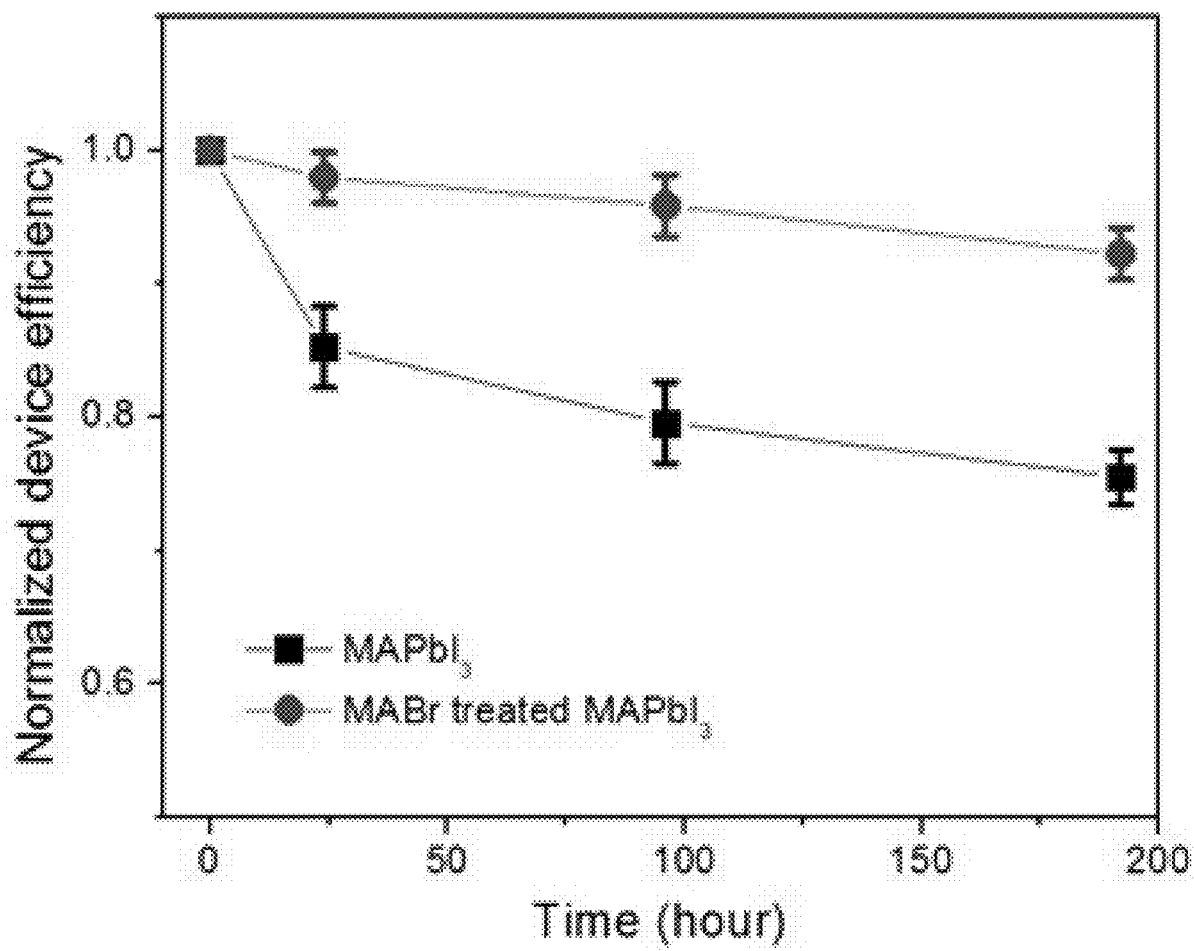
FIG. 12 illustrates a comparison of the stability perovskite solar cells based on $MAPbI_3$ and MABr-treated $MAPbI_3$ films made by methods according to some embodiments of the present disclosure.

FIG. 12 illustrates a comparison of the stability perovskite solar cells based on MAPbI$_3$ and MABr-treated MAPbI$_3$ films. About 4-12 individual cells were measured for each type of devices to check the statistics of device performance. The MAPbI$_{3-x}$Br$_x$ perovskite solar cell resulting from treating the starting MAPbI$_3$ films with a MABr solution is much more stable than the starting MAPbI$_3$ films. This stability improvement may be attributed to Br inclusion into the final device, and also due to the larger crystal grain sizes.

MABr Concentration Effect.

To further explore the importance of the MABr solution and its concentration for this observed film and device improvement the effect of varying MABr solution concentration on the properties of the final treated MAPbI$_{3-x}$Br$_x$ films was studied. The average or low-quality MAPbI$_3$ films prepared with standard solvent techniques can vary significantly from batch-to-batch and/or within different areas of the same sample. Therefore, for the studies described in this section, the high-quality MAPbI$_3$ films were cut from a large-area sample to insure good quality and reliable material properties. FIGS. 13A-D illustrate SEM images of a high-quality MAPbI$_3$ film and those of high-quality MAPbI$_3$ films treated with different MABr concentrations (from 2 to 8 mg/mL). The high-quality MAPbI$_3$ film is compact and pinhole-free with crystal sizes ranging from 200-500 nm. With an 8 mg/mL MABr treatment, the crystal size of MAPbI$_{3-x}$Br$_x$ becomes larger than the MAPbI$_3$ film, but there is clear evidence of pinhole formation and the surface also becomes rougher, which is similar to the films prepared with the spin-coating-based sequential deposition method. When the MABr concentration is reduced to 4 mg/mL, the MAPbI$_{3-x}$Br$_x$ film becomes less coarse with larger crystal size than the MAPbI$_{3-x}$Br$_x$ film treated with 8 mg/mL MABr solution. With further reduction of the MABr concentration to 2 mg/mL, the MAPbI$_{3-x}$Br$_x$ film becomes compact with micron-sized (up to 1-2 μm) grains containing some small perovskite nanocrystals. Such dramatic morphology change is similar to those obtained from a low-quality MAPbI$_3$ film (see FIGS. 4A and 4B), suggesting that this simple post-growth treatment with a low-concentration MABr solution may effectively reconstruct perovskite thin films such that the initial structural defects from a low-quality perovskite thin film may be significantly improved.

Figure 13A:
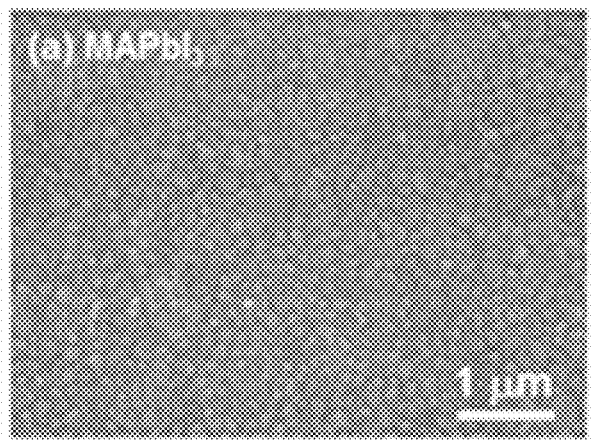
FIGS. 13A-F illustrate the effects of MABr concentration on smooth, pinhole-free $MAPbI_3$ thin films made by methods according to some embodiments of the present disclosure: Top view of SEM images of (FIG. 13A) a pinhole-free high-quality $MAPbI_3$ thin film and those treated with (FIG. 13B) 8 mg/mL, (FIG. 13C) 4 mg/mL, and (FIG. 13D) 2 mg/mL MABr solutions. Plots of (FIG. 13E) UV-vis absorption spectra and (FIG. 13F) XRD patterns of the high-quality $MAPbI_3$ thin films without and with MABr treatment at different concentrations, as indicated.
Figure 13B:
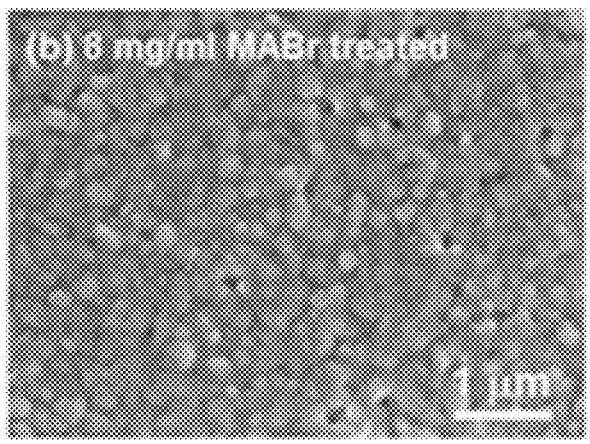
Figure 13C:
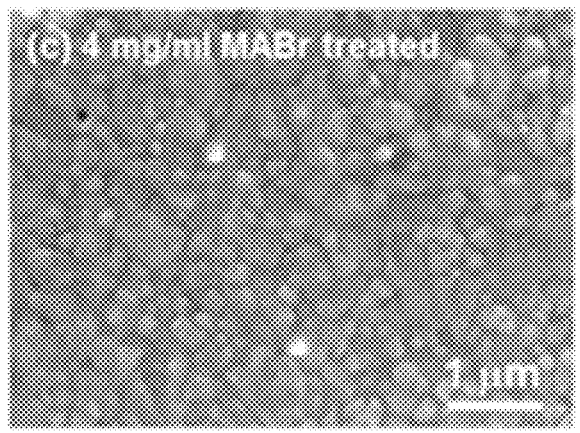
Figure 13D:
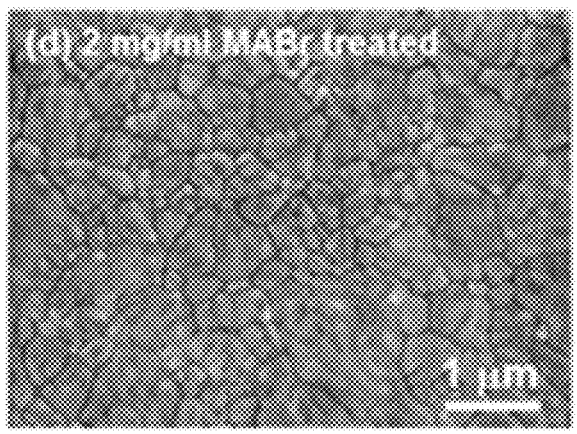
Figure 13E:
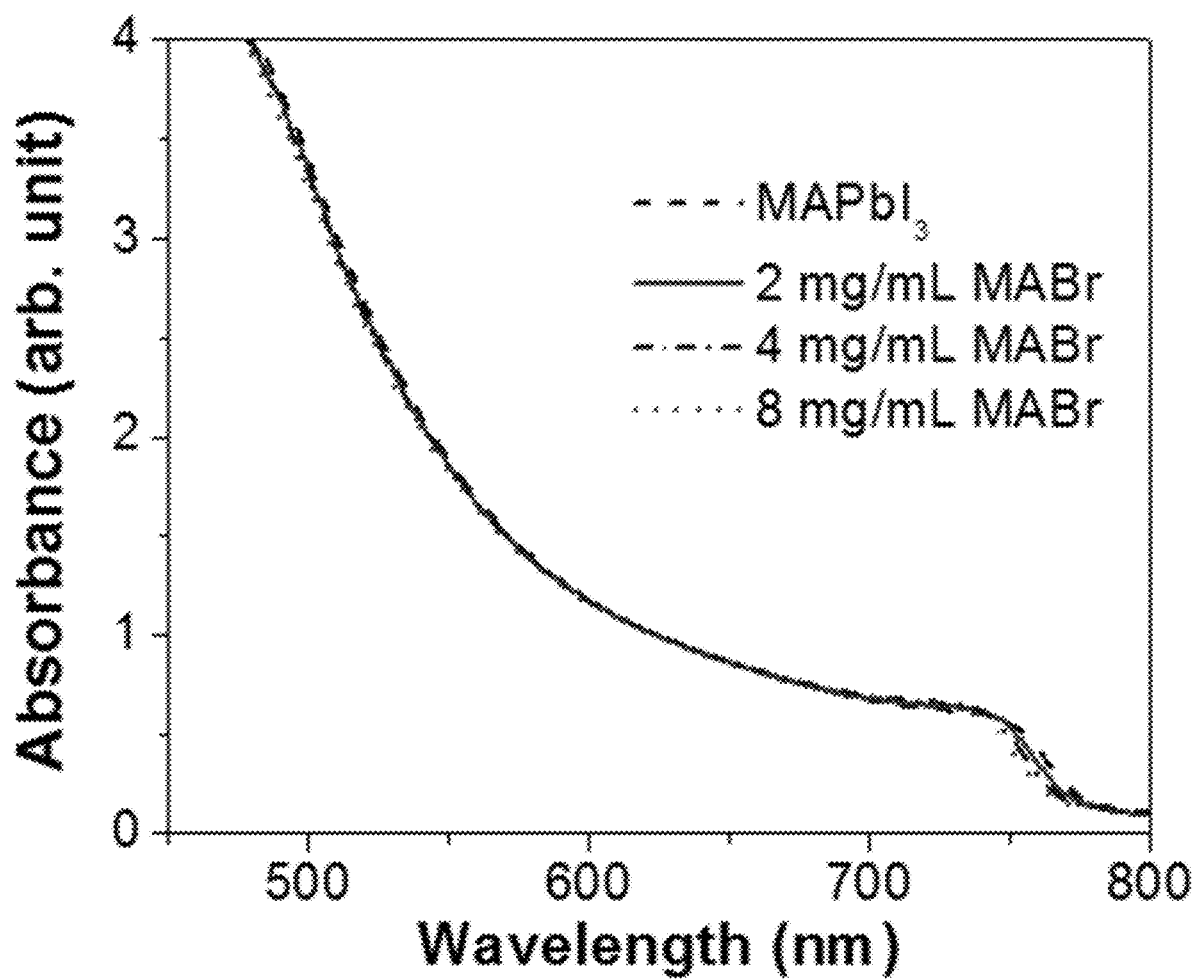

With increasing MABr concentration, the UV-vis absorption data (see FIG. 13E) show a systematic blue shift of the absorption edge for the MABr-treated MAPbI$_{3-x}$Br$_x$, suggesting a higher amount of Br incorporation. When the high-quality MAPbI$_3$ film is treated with an 8 mg/mL MABr solution, the UV-vis absorption spectrum of the resulting film exhibits an ~12-nm blue shift of the absorption edge but no obvious change in the absorbance. The shift in the absorption edge with increasing MABr concentration is a clear indication of Br inclusion into MAPbI$_3$ to form the mixed-halide MAPbI$_{3-x}$Br$_x$, which is consistent with the XRD results. The (110) peak location increases very slightly but noticeably from about 14.10 to 14.14 degrees with 8 mg/mL MABr treatment. However, the peak intensity reaches a maximum at 2 mg/mL MABr followed by a continuous decrease with higher MABr concentration, which may be caused by the deterioration of the grain morphology (as shown in FIGS. 13A-D).

Figure 13F:
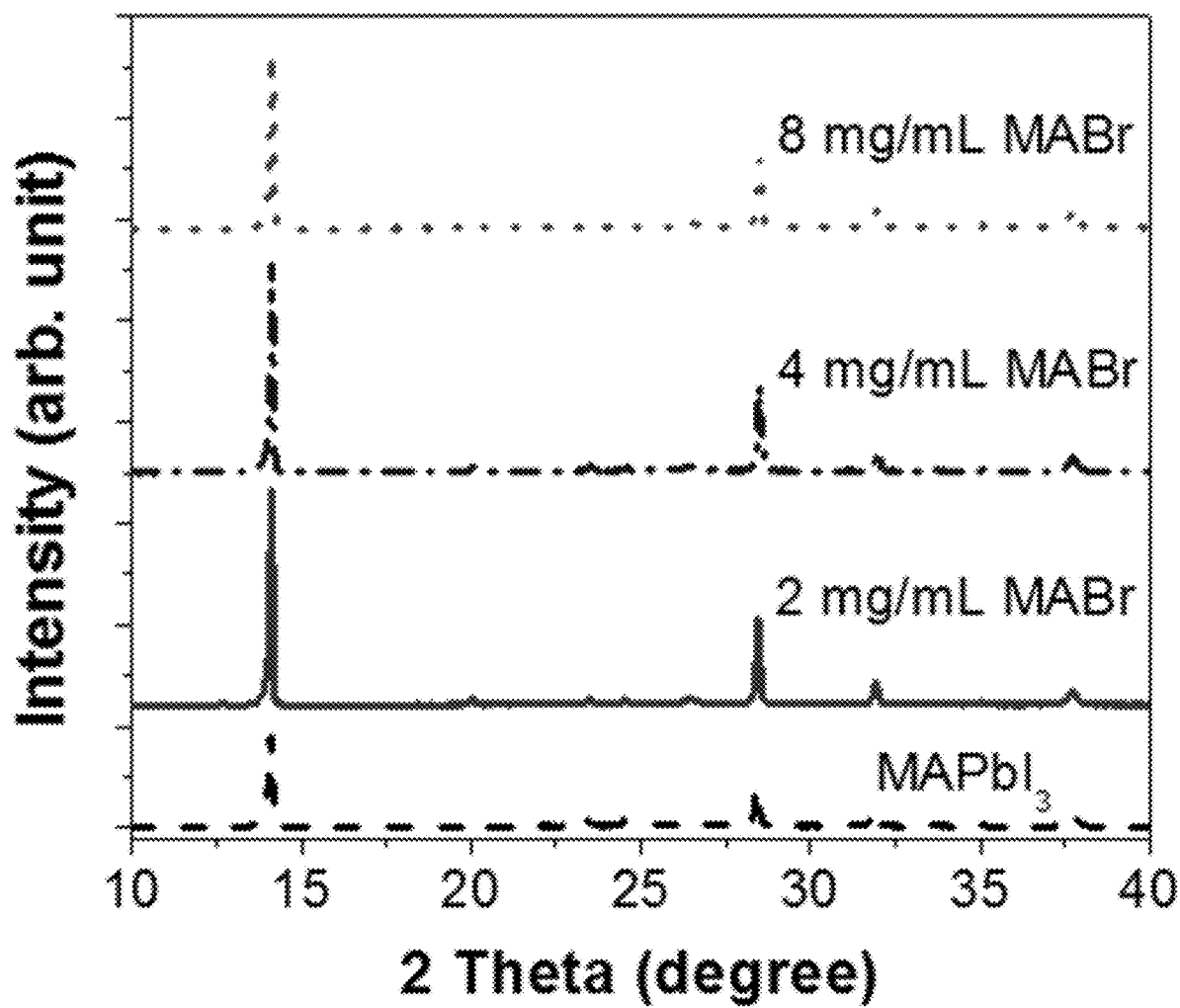
Figure 14A:
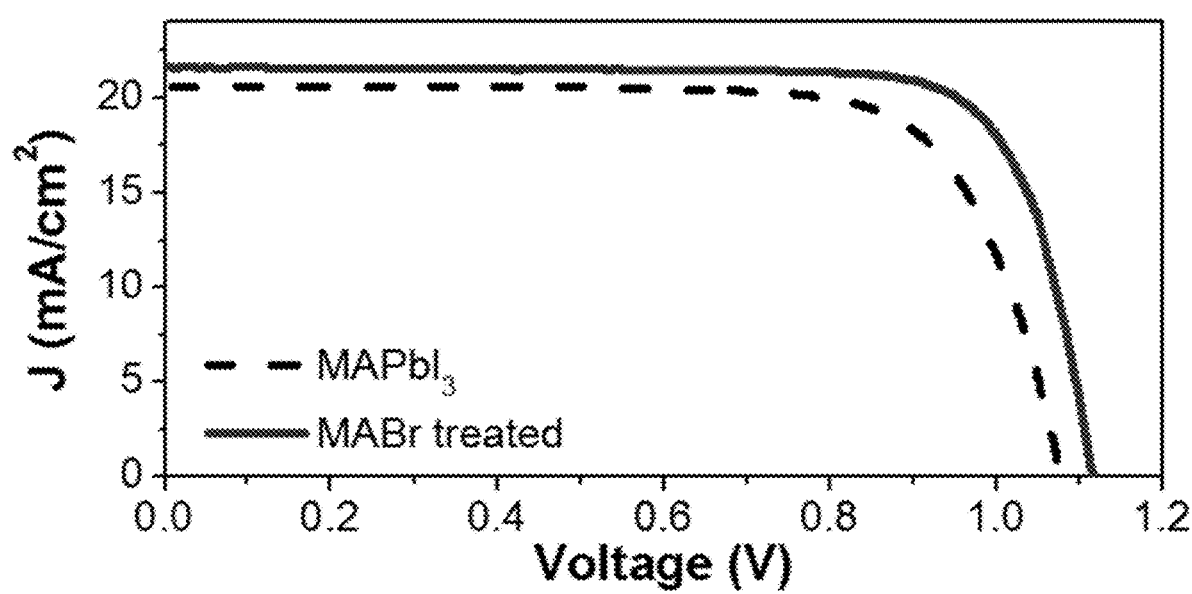
FIGS. 14A-C illustrate device characteristics based on high-quality pinhole-free $MAPbI_3$ thin films mad with and without MABr treatment, made by methods according to some embodiments of the present disclosure.
Figure 14B:
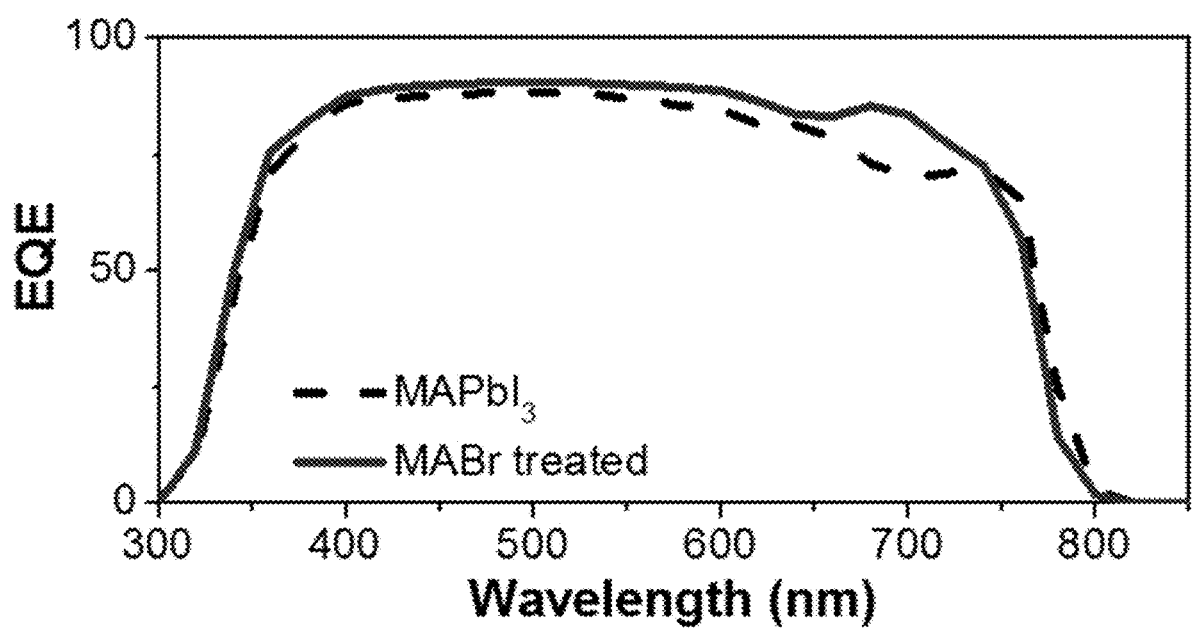
Figure 14C:
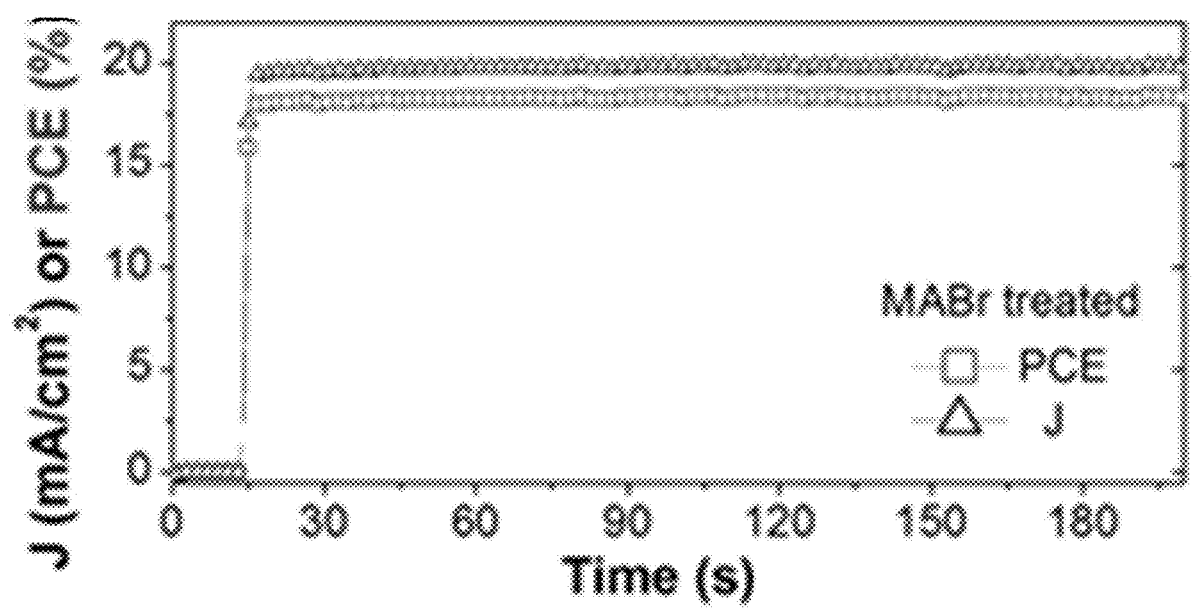
Figure 15:
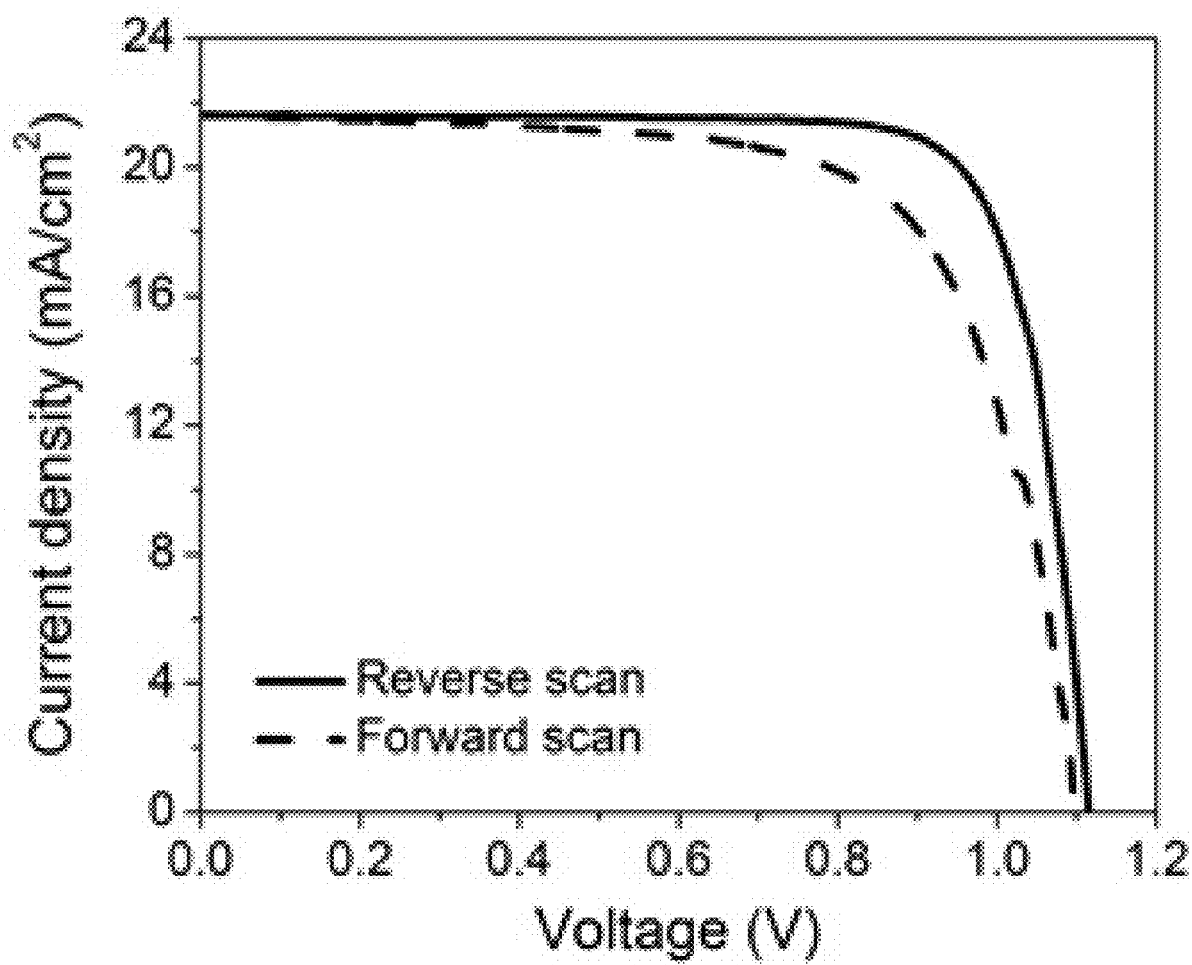
FIG. 15 illustrates J-V curves with both forward and reverse scans for cells made by methods according to some embodiments of the present disclosure: for the reverse scan, the device shows a PCE of 19.12%, with $J_{sc}$ of 21.60 mA/cm², $V_{oc}$ of 1.12 V, and FF of 0.793. For the forward scan, the device shows a PCE of 16.43%, with $J_{sc}$ of 21.61 mA/cm², $V_{oc}$ of 1.097 V, and FF of 0.693.

Although the compositional change of the MAPbI$_3$ film caused by the mild 2 mg/mL MABr treatment is very minimum as reflected by the small absorption edge shift (<5 nm) and almost identical XRD peak positions (shifted by ~0.01°-0.02°), the morphology change and XRD peak intensity increase are very dramatic, and more importantly, such changes have very little dependence on initial MAPbI$_3$ film quality (see FIG. 13F). The very small compositional change is consistent with the X-ray photoelectron spectroscopy (XPS) measurement (FIG. 16A), which suggests a small amount (~1%) of Br incorporation in the surface layer of 2 mg/mL MABr-treated perovskite film. FIG. 14A shows the J-V curves for PSCs based on the high-quality MAPbI$_3$ films with and without the 2 mg/mL MABr treatment. The pristine MAPbI$_3$-based PSC displays a best PCE of 16.63% with J$_{sc}$ of 20.67 mA/cm$^2$, V$_{oc}$ of 1.08 V, and FF of 0.746. Such a performance level is also consistent with previous reports using the standard solvent-engineering or fast-crystallization processing. With the MABr treatment, the device efficiency reaches 19.12% with J$_{sc}$ of 21.60 mA/cm$^2$, V$_{oc}$ of 1.12 V, and FF of 0.793. The improvement of device parameters is very similar to the devices based on average/low-quality perovskite film. FIG. 14B compares the EQE spectra of the two devices shown in FIG. 14A. The integrated current densities match well with their corresponding J$_{sc}$ values from the J-V curves. Because there is still a noticeable (and expected) hysteresis behavior for this compact-TiO$_2$-based planar PSC (FIG. 15), a stabilized power output was measured over time near the maximum power output point to verify the performance of the PSC. FIG. 14C shows that a 18.3% PCE was steadily recorded over several minutes, which matches the J-V curve reasonably well and further attests the effectiveness of the simple MABr treatment to improving device performance.

In contrast to the much-improved device performance with 2 mg/mL MABr treatment, the PSCs based on 8 and 4 mg/mL treated MAPbI$_{3-x}$Br$_x$ films exhibit lower device performance, especially the one with 8 mg/mL MABr treatment (see Table 1 below). This concentration dependence is consistent with the structure/morphology changes discussed in connection with FIGS. 13A-F along with the change in stoichiometry. These results suggest that the simple Br incorporation may not significantly increase PSC performance by only forming MAPbI$_{3-x}$Br$_x$ perovskite films with relatively high Br concentration without affecting the perovskite film/structure properties.

TABLE 1

MABr concentration effect on the typical photovoltaic parameters. Standard deviations from 8-12 cells for each type of devices are given. For these devices, high-quality MAPbI$_3$ films (FIG. 3A) were used as the initial films prior to MABr treatment.

| MABr Concentration (mg/mL) | $J_{sc}$ (mA/cm$^2$) | $V_{oc}$ (V) | FF | PCE (%) |
|---|---|---|---|---|
| 0 | 20.54 ± 0.07 | 1.052 ± 0.027 | 0.724 ± 0.012 | 15.64 ± 0.63 |
| 2 | 21.86 ± 0.12 | 1.120 ± 0.010 | 0.754 ± 0.020 | 18.50 ± 0.39 |
| 4 | 21.48 ± 0.28 | 1.056 ± 0.005 | 0.734 ± 0.014 | 16.66 ± 0.48 |
| 8 | 21.27 ± 0.16 | 1.049 ± 0.011 | 0.665 ± 0.031 | 14.83 ± 0.47 |

Figure 16A:
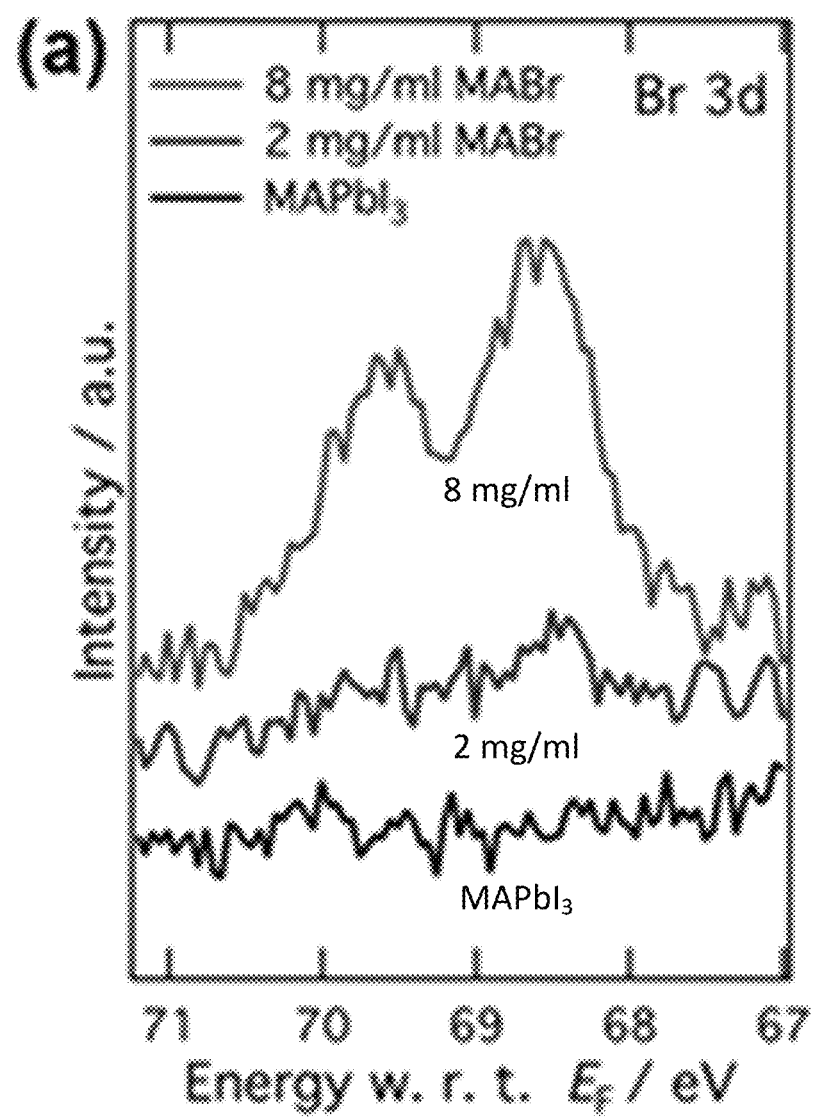
FIGS. 16A-D illustrate the effects of MAI treatment on XPS core-level analysis and film morphology for films made by methods according to some embodiments of the present disclosure.

FIG. 16A shows XPS measurements of the MAPbI$_3$ films after 2 mg/mL and 8 mg/mL MABr treatment. In addition to the strong I 3d signal for all samples (see FIGS. 7A and 7B), there is a clear but weak Br 3d signal for the 2 mg/mL MABr-treated films. XPS measurements indicate a very low concentration of <1% for bromine in the halide content in the surface layer. Such low Br concentration is consistent with the XRD results and UV-vis spectra of the MABr-treated MAPbI$_{3-x}$Br$_x$ film (see FIGS. 13E and 13F). In contrast, the 8 mg/mL MABr-treated MAPbI$_{3-x}$Br$_x$ has almost 8 times higher Br concentration than the 2 mg/mL MABr-treated sample.

The abovementioned results clearly demonstrate that the MABr treatment methods described herein, when utilizing the proper concentrations, are effective at converting an average or sub-average MAPbI$_3$ perovskite film into a high-quality MAPbI$_{3-x}$Br$_x$ film with larger crystal size and higher crystalline order. It appears that the MABr solution with low concentration such as 2 mg/mL may induce the recrystallization of the small-sized MAPbI$_3$ into perovskite films with much larger final grain sizes. In contrast, the higher-concentration MABr treatments may only induce a Br/I halide exchange reaction in the MAPbI$_3$ film without significantly affecting the grain growth. The most interesting finding from this two-step perovskite crystal growth process is that it is largely invariant to the initial MAPbI$_3$ film quality (see FIGS. 4A, 4B, 5, and 6 and FIGS. 13A-F).

Thus, a process for fabricating high-quality MAPbI$_{3-x}$Br$_x$ may be divided into two steps. The first step may include the formation of MAPbI$_3$ precursor nanocrystals by standard solvent and/or vapor-phase deposition methods to form a relatively compact thin film. The second step may then include conversion of the first-formed MAPbI$_3$ precursor nanocrystals into higher quality MAPbI$_{3-x}$Br$_x$ perovskite films with larger crystal sizes by contacting the first-formed MAPbI$_3$ precursor nanocrystals with a MABr-containing solution. Thus, such a two-step process, with a second MABr treatment step, may convert both high quality and low quality MAPbI$_3$ perovskite films into final MAPbI$_{3-x}$Br$_x$ thin films with high quality. However, the process is MABr concentration dependent. For high-concentration (e.g., 8 mg/mL) MABr solutions, the dissolution of small-size MAPbI$_3$ may be inhibited by the intercalation of MABr or the I/Br cation exchange reaction, which could account for less morphology change or grain-size growth found with the high-concentration MABr treatment. For low-concentration (e.g., 2 mg/mL) MABr treatments, the small-sized MAPbI$_3$ crystals may be quickly dissolved and regrown into larger crystals.

Figure 16B:
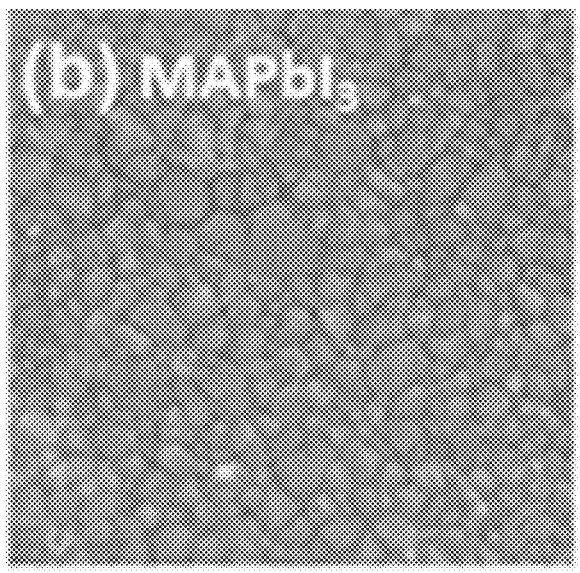
Figure 16C:
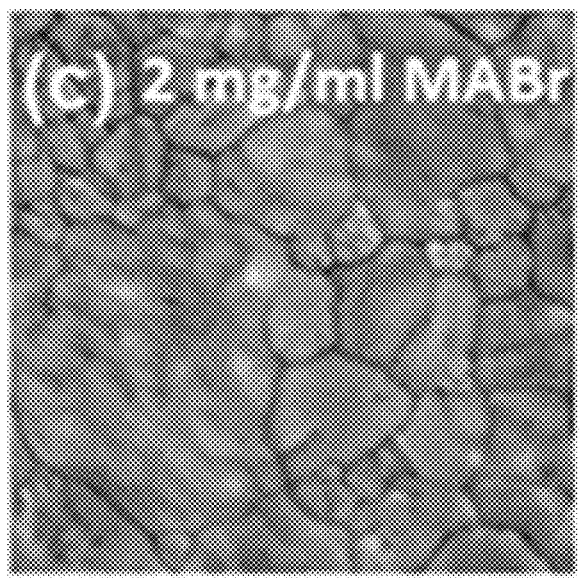
Figure 16D:
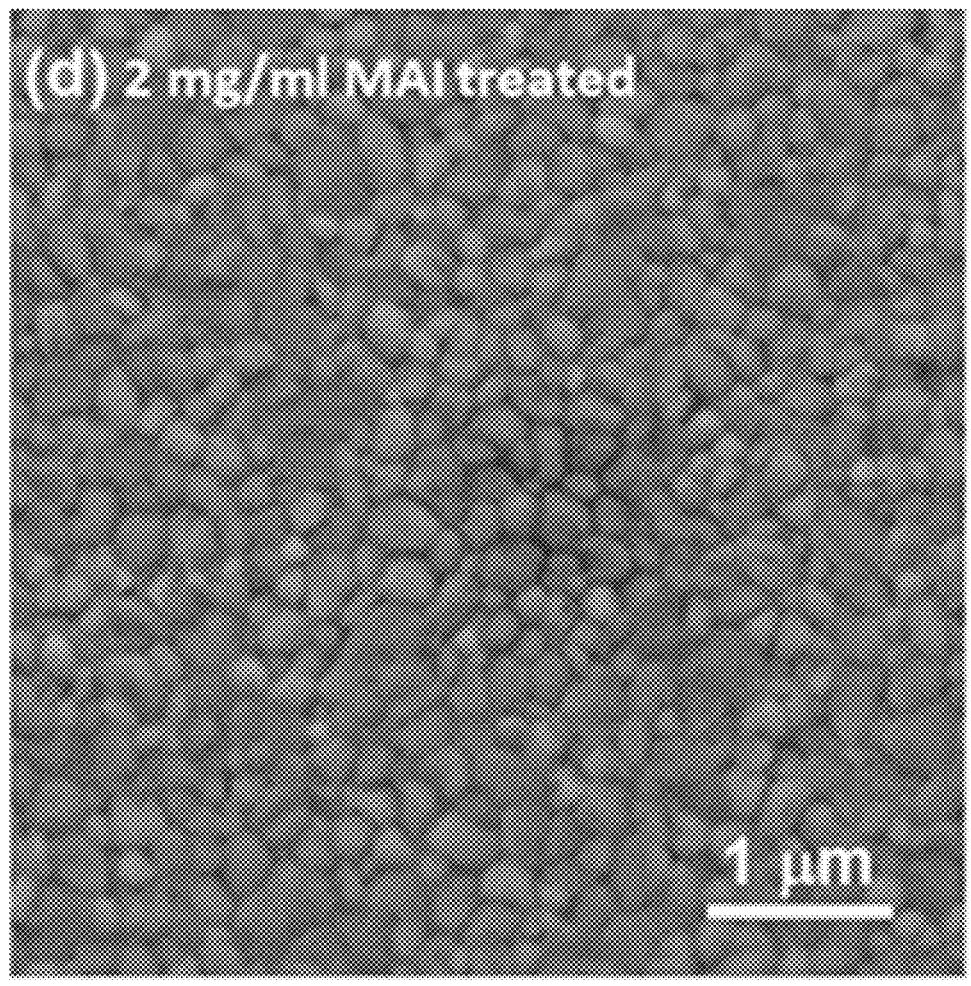
Figure 17:
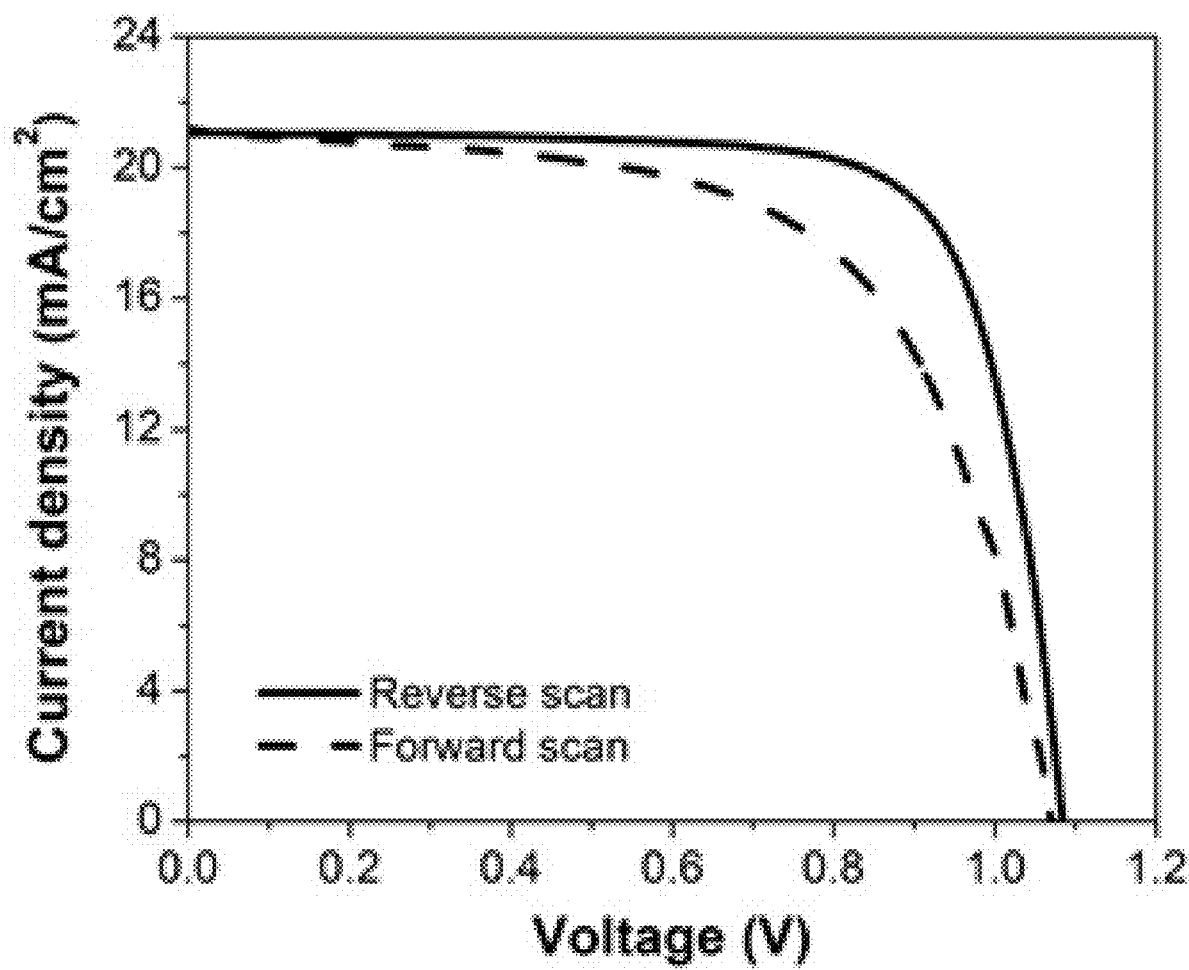
FIG. 17 illustrates J-V curves with both forward and reverse scans for a cell made using MAI treatment according to some embodiments of the present disclosure: For the reverse scan, the device shows a PCE of 17.11%, with $J_{sc}$ of 21.05 mA/cm², $V_{oc}$ of 1.084 V, and FF of 0.749. For the forward scan, the device shows a PCE of 13.93%, with $J_{sc}$ of 21.18 mA/cm², $V_{oc}$ of 1.071 V, and FF of 0.614.

To further test whether the observed perovskite reconstruction is not simply resulting from excess organic salt, the effect of using a similar MAI treatment on the morphology changes of MAPbI$_3$ film was studied. FIG. 16D shows the SEM image of a high-quality MAPbI$_3$ film after post-growth treatment with 2 mg/mL MAI solution. For comparison, the SEM images of the pristine MAPbI$_3$ film and the MABr-treated MAPbI$_{3-x}$Br$_x$ film are shown in FIGS. 16B and 16C, respectively. The grain size increased slightly with MAI treatment; however, the degree of grain growth was significantly limited in comparison to the MABr treatment. The best PSC based on MAI treatment shows a PCE of about 17.11% (see FIG. 17), which is significantly lower than the performance of a PSC based on the MABr treatment. These results suggest that besides the MABr concentration, using MABr itself (rather than MAI) may also be important to the process.

As used herein, the term "substantially" refers to the inherent variability present in attempts to attain an exact design parameter. For example, when describing solubility as "substantially soluble" or "substantially insoluble" it is clear of to one of ordinary skill in the art that there for "substantially soluble" Component A, there may still be small concentrations of insoluble Component A in the solution. Similarly, for "substantially insoluble" Component B, there may be small concentrations of soluble Component B in the solution. Similarly, "substantially" separate and distinct films that share an interface indicate that the films may be essentially layered and/or laminated with a distinct interface between them. However, the films may also have less areas at the interface that are less defined, due at least to a portion of one layer being transformed into part of the second layer. Thus, the interface between a first layer and a second layer may include a third transition layer between the first layer and the second layer.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
an alkyl ammonium metal halide film comprising lead and a first halogen; and
an alkyl ammonium metal mixed-halide film comprising the first halogen and a second halogen, wherein:
the alkyl ammonium metal mixed-halide film is adjacent to the alkyl ammonium metal halide film,
the alkyl ammonium metal mixed-halide film comprises grains having a characteristic length between 1 micron and 2 microns, inclusively,
the alkyl ammonium metal mixed-halide film has less than 0.25 pin-holes/$\mu m^2$,
the alkyl ammonium metal halide film has a thickness between 1 nanometer and 1000 nanometers, inclusively, and
the alkyl ammonium metal mixed-halide film has a second thickness that is less than the first thickness.

2. The device of claim 1, wherein the second thickness is between 1 nanometer and 1000 nanometers, inclusively.

3. The device of claim 1, wherein at least one of the alkyl ammonium metal halide film or the alkyl ammonium metal mixed-halide film further comprises at least one of tin or germanium.

4. The device of claim 1, wherein the alkyl ammonium metal halide film comprises at least one of $CH_3NH_3PbI_3$ or $CH(NH_2)_2PbI_3$.

5. The device of claim 1, wherein:
the alkyl ammonium lead mixed-halide film comprises at least one of $CH_3NH_3PbI_{3-x}Br_x$ or $CH(NH_2)_2PbI_{3-x}Br_x$, and
x is between greater than 0 and less than 3.

6. The device of claim 1, wherein the first thickness is between 3 nanometers and 300 nanometers, inclusively.

7. The device of claim 1, wherein the alkyl ammonium metal mixed-halide film further comprises a peak location at 14.14 degrees.

* * * * *